United States Patent
Shimba et al.

(10) Patent No.: US 9,738,763 B2
(45) Date of Patent: Aug. 22, 2017

(54) RESIN COMPOSITION, RESIN SHEET, AND PRODUCTION METHOD FOR SEMICONDUCTOR DEVICE

(71) Applicant: TORAY INDUSTRIES, INC., Tokyo (JP)

(72) Inventors: Yoichi Shimba, Otsu (JP); Kazuyuki Matsumura, Otsu (JP); Toshihisa Nonaka, Otsu (JP)

(73) Assignee: TORAY INDUSTRIES, INC., Tokyo (JP)

(*) Notice: Subject to any disclaimer, the term of this patent is extended or adjusted under 35 U.S.C. 154(b) by 0 days.

(21) Appl. No.: 14/783,641

(22) PCT Filed: May 30, 2014

(86) PCT No.: PCT/JP2014/064395
§ 371 (c)(1),
(2) Date: Oct. 9, 2015

(87) PCT Pub. No.: WO2014/199843
PCT Pub. Date: Dec. 18, 2014

(65) Prior Publication Data
US 2016/0083537 A1    Mar. 24, 2016

(30) Foreign Application Priority Data

Jun. 13, 2013 (JP) ................................ 2013-124430
Nov. 15, 2013 (JP) ................................ 2013-236570

(51) Int. Cl.
*C08J 5/18* (2006.01)
*C08K 5/07* (2006.01)
(Continued)

(52) U.S. Cl.
CPC ................. *C08J 5/18* (2013.01); *B29C 41/02* (2013.01); *C08K 3/0033* (2013.01); *C08K 5/07* (2013.01); *C08K 9/04* (2013.01); *H01L 21/50* (2013.01); *H01L 21/6836* (2013.01); *H01L 24/27* (2013.01); *H01L 24/29* (2013.01); *H01L 24/81* (2013.01); *H01L 24/83* (2013.01); *B29K 2063/00* (2013.01); *B29K 2105/16* (2013.01); *B29K 2509/00* (2013.01); *C08J 2363/00* (2013.01); *H01L 23/49558* (2013.01); *H01L 24/11* (2013.01); *H01L 24/13* (2013.01); *H01L 24/16* (2013.01); *H01L 24/32* (2013.01); *H01L 2021/603* (2013.01); *H01L 2221/68327* (2013.01); *H01L 2224/1134* (2013.01); *H01L 2224/1146* (2013.01); *H01L 2224/131* (2013.01); *H01L 2224/16145* (2013.01); *H01L 2224/16225* (2013.01); *H01L 2224/16227* (2013.01); *H01L 2224/271* (2013.01); *H01L 2224/27003* (2013.01); *H01L 2224/27334* (2013.01); *H01L 2224/2929* (2013.01); *H01L 2224/29387* (2013.01); *H01L 2224/29388* (2013.01); *H01L 2224/29499* (2013.01); *H01L 2224/32145* (2013.01); *H01L 2224/32225* (2013.01); *H01L 2224/32245* (2013.01); *H01L 2224/73204* (2013.01); *H01L 2224/81191* (2013.01); *H01L 2224/81193* (2013.01); *H01L 2224/81204* (2013.01); *H01L 2224/81801* (2013.01); *H01L 2224/81903* (2013.01); *H01L 2224/83101* (2013.01); *H01L 2224/83191* (2013.01); *H01L 2224/83192* (2013.01); *H01L 2224/83204* (2013.01); *H01L 2224/83862* (2013.01); *H01L 2224/83874* (2013.01); *H01L 2224/9211* (2013.01);
(Continued)

(58) Field of Classification Search
None
See application file for complete search history.

(56) References Cited

U.S. PATENT DOCUMENTS

| 2011/0135911 A1* | 6/2011 | Maenaka | ................ B32B 27/20 428/327 |
| 2013/0113121 A1* | 5/2013 | Okada | .................. C09D 7/1216 257/787 |
| 2014/0291870 A1 | 10/2014 | Shimba et al. | |

FOREIGN PATENT DOCUMENTS

| JP | 11-092549 A | 4/1999 |
| JP | 2011-63678 A | 3/2011 |

(Continued)

OTHER PUBLICATIONS

Translation of JP1192549.*

(Continued)

*Primary Examiner* — Whitney T Moore
(74) *Attorney, Agent, or Firm* — Birch, Stewart, Kolasch & Birch, LLP

(57) ABSTRACT

Provided is a resin sheet, wherein in a stress measurement in which a dynamic shear strain is applied in a direction parallel to a surface, the difference between a loss tangent as measured when a strain amplitude is 10% of the sheet thickness and a loss tangent as measured when the amplitude is 0.1% is equal to or greater than 1 at a temperature of 80° C. and a frequency of 0.5 Hz. The resin sheet of the present invention can provide a semiconductor device with excellent connection reliability, wherein air bubbles and cracks are less likely to occur in the resin sheet. In the resin composition of the present invention, aggregates are less likely to occur during storage. The resin sheet obtained by forming the resin composition into a sheet has good flatness. The hardened material thereof can provide a circuit board or a semiconductor device with high connection reliability.

12 Claims, No Drawings

(51) Int. Cl.
| | |
|---|---|
| *B29C 41/02* | (2006.01) |
| *C08K 9/04* | (2006.01) |
| *H01L 21/50* | (2006.01) |
| *H01L 23/00* | (2006.01) |
| *H01L 21/683* | (2006.01) |
| *C08K 3/00* | (2006.01) |
| *H05K 3/30* | (2006.01) |
| *H01L 23/495* | (2006.01) |
| *B29K 63/00* | (2006.01) |
| *B29K 105/16* | (2006.01) |
| *B29K 509/00* | (2006.01) |
| *H01L 21/603* | (2006.01) |

(52) U.S. Cl.
CPC ............ *H01L 2225/06513* (2013.01); *H01L 2924/15787* (2013.01); *H01L 2924/15788* (2013.01); *H01L 2924/3512* (2013.01); *H05K 3/305* (2013.01)

(56) References Cited

FOREIGN PATENT DOCUMENTS

| | | |
|---|---|---|
| JP | 2011-95731 A | 5/2011 |
| JP | 2012-104716 A | 5/2012 |
| WO | WO 2012/043764 A1 | 4/2012 |
| WO | WO 2013/080708 A1 | 6/2013 |

OTHER PUBLICATIONS

International Search Report issued in PCT/JP2014/064395, mailed on Jul. 22, 2014.

Written Opinion issued in PCT/JP2014/064395, mailed on Jul. 22, 2014.

* cited by examiner

RESIN COMPOSITION, RESIN SHEET, AND PRODUCTION METHOD FOR SEMICONDUCTOR DEVICE

TECHNICAL FIELD

The present invention relates to a resin composition that can be used to bond electronic parts used in, for example, personal computers and portable terminals to a board such as a printed board or a flexible board, bond electronic parts to electronic parts, and bond a board to a board. More particularly, the present invention relates to a resin composition that is used in bonding a semiconductor chip such as IC or LSI to a circuit board such as a flexible board, a glass epoxy board, a glass board, a ceramic board, or a silicon interposer, bonding a semiconductor chip to a semiconductor chip, and in semiconductor chip lamination such as three-dimensional packaging. Furthermore, the present invention relates to a resin composition that can be used for an insulating layer, an etching resist, a solder resist, and the like which are used to manufacture a circuit board such as a build-up multilayer board.

BACKGROUND ART

In recent years, as semiconductor devices become smaller in size and denser, flip chip packaging has received attention and been spreading rapidly as a technique for mounting a semiconductor chip to a circuit board. In the flip chip packaging, it is common to employ bonding a semiconductor chip to a circuit board using a resin composition as a method for securing the electrical connection reliability at a joint of metal electrodes. Examples of the bonding method using a resin composition include a method in which a pasty resin composition containing a solvent is applied to the surface of one of bonding objects, and the solvent is removed, after which heat and pressure is applied to bond the bonding objects and at the same time harden the resin composition, and a method in which a pasty resin composition is applied to an exfoliative substrate in advance, and then a solvent is removed to produce a resin sheet, which is used to bond bonding objects. In manufacturing a build-up multilayer board in which conductor layers and insulating layers are alternately laminated, the resin composition may also be used a the insulating layers in the form of a hardened resin composition. Such resin compositions are being frequently used in various applications such as electrical and electronic applications, building applications, automotive applications, and aircraft applications (see, for example, Patent Documents 1 to 2).

The above resin sheet is designed such that it does not have adhesion at room temperature in view of handleability at room temperature but softens to exhibit adhesion when heated to about 100° C. When softened by heating, the resin composition constituting the resin sheet preferably has a low melt viscosity. However, the resin sheet has the disadvantage of gradually hardening during storage and increasing its melt viscosity, and an improvement in storage stability has been demanded. To this problem, techniques are disclosed for improving the storage stability at 100° C. or lower by using a microcapsule type hardening acceleration agent (see, for example, Patent Documents 3 to 4).

In addition, there is a problem in that the hardened resin composition greatly expands and contracts with changes in temperature, producing a stress inside the resulting semiconductor device, which results in reduced reliability of the device. To this problem, techniques are known to add inorganic particles into a resin composition in order to bring the coefficient of linear expansion of the hardened resin composition close to low coefficients of linear expansion of a semiconductor chip and a circuit board (see, for example, Patent Documents 1 to 4).

PRIOR ART DOCUMENTS

Patent Documents

Patent Document 1: JP 11-92549 A
Patent Document 2: JP 2011-95731 A
Patent Document 3: JP 2011-63678 A
Patent Document 4: WO 2012/043764

SUMMARY OF THE INVENTION

Problems to be Solved by the Invention

Unfortunately, semiconductor devices manufactured by bonding a semiconductor chip to a semiconductor chip or a semiconductor chip to a board via a conventional resin sheet to join metal electrodes sometimes exhibited poor connection reliability in, for example, a thermal cycle test.

An object of the present invention is to provide a resin sheet that can provide a semiconductor device with high connection reliability, wherein air bubbles and cracks which may reduce the connection reliability are less likely to occur in the resin sheet after bonding and hardening.

Furthermore, a pasty resin composition in which inorganic particles are blended in large amounts had a problem in that aggregates are gradually generated during storage. Due to this problem, for example, a sheet formed from the pasty resin composition had poor flatness, and electronic parts, a board, and the like sometimes could not be successfully bonded.

Another object of the present invention is to provide a resin composition that can provide a semiconductor device with high connection reliability, wherein the occurrence of aggregates is reduced.

Means for Solving the Problems

The present invention is a resin sheet, wherein in a stress measurement in which a dynamic shear strain is applied in a direction parallel to a surface, the difference between a loss tangent as measured when a strain amplitude is 10% of the sheet thickness and a loss tangent as measured when the amplitude is 0.1% of the sheet thickness is equal to or greater than 1 at a room temperature of 80° C. and a frequency of 0.5 Hz.

Another aspect of the present invention is a resin composition containing an epoxy compound (a), a microcapsule type hardening acceleration agent (b), inorganic panicles (c), and a compound (d) represented by Formula (1).

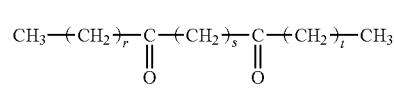

In the above Formula (1), p s, and t each represent an integer of 0 to 2.

Another aspect of the present invention is a method of producing a resin sheet, comprising applying the resin composition described above to an exfoliative substrate, and then removing volatile components.

Still another aspect of the present invention is a method of manufacturing a semiconductor device, comprising interposing the resin sheet described above or a resin sheet obtained by the production method described above between a first circuit component and a second circuit component, and electrically connecting the first circuit component and the second circuit component by applying heat and pressure.

Effects of the Invention

The resin sheet of the present invention can provide a semiconductor device with excellent connection reliability, wherein air bubbles and cracks are less likely to occur in the resin sheet. In the resin composition of the present invention, aggregates are less likely to occur during storage. The resin sheet obtained by forming the resin composition into a sheet has good flatness. The hardened material thereof can provide a circuit board or a semiconductor device with high connection reliability.

MODE FOR CARRYING OUT THE INVENTION

The resin sheet of the present invention has loss tangent values, as determined in a stress measurement (dynamic shear stress measurement) in which a dynamic shear strain is applied in a direction parallel to a surface, that meet the requirement below. Specifically, the difference between a loss tangent as measured when a strain amplitude is 10% of the sheet thickness and a loss tangent as measured when the amplitude is 0.1% of the sheet thickness is equal to or greater than 1 at a temperature of 80° C., and a frequency of 0.5 Hz. This difference in loss tangent is hereinafter referred to as loss tangent differential.

In the dynamic shear stress measurement, a shear strain is applied to a sample at a given frequency, and the stress response at this time is separated into a real part (elastic term) and an imaginary part (viscous term) for the strain and evaluated. The loss tangent is the ratio of the imaginary part to the real part. Examples of the apparatus for evaluation include a rheometer "AG-G2" (trade name, manufactured by TA Instruments).

In general, in liquid materials, viscosity is dominant under shear strain. In contrast, in hardened materials, elasticity is dominant under shear strain. Semisolid materials such as resin sheets exhibit both the viscosity and the elasticity. The property of exhibiting elasticity in a region under small shear strain and viscosity in a region under large shear strain is called thixotropy. In the present invention, the thixotropy of the resin sheet is defined using the loss tangent described above, and the range required is defined. Since the loss tangent is the ration of a viscous term to an elastic term, the degree of increase in loss tangent with increasing strain represents the degree of thixotropy of an object. In other words, the larger the loss tangent differential the larger the thixotropy of the resin sheet.

The inventors discovered that in a method in which a semiconductor chip and a board are bonded via a resin sheet to join metal electrodes, the thixotropy of the resin sheet is closely related to connection reliability. The reason for this is not clear, but it can be considered that when a metal electrode is embedded into a resin sheet dining bonding, the strain of the resin sheet is large in a region near the metal electrode, whereas the strain of the resin sheet is small in a region away from the metal electrode, and the difference in viscoelasticity between these two regions of the resin sheet is related to whether the connection is good or bad. Specifically, due to the thixotropy of the resin sheet, the resin sheet is viscous in the region near the metal electrode where the strain is large, and consequently, the metal electrode is readily embedded while displacing the resin sheet to provide good contact of opposite metal electrodes. In contrast, the resin sheet is elastic in the region away from the metal electrode where the strain is small, and consequently, air bubbles entrained during bonding are readily pushed out or eliminated by the pressure doing the bonding. Air bubbles, if present in the resin sheet, can cause cracks in the resin sheet after hardening when heat or an impact is applied to a semiconductor device, whereby stresses are concentrated at a joint of metal electrodes to fracture the joint, leading to reduced connection reliability of the semiconductor device. As seen above, the two effects, contact of metal electrodes and prevention of air bubble, are considered to improve the connection reliability of a semiconductor device.

Furthermore, it was found that a resin sheet having high thixotropy has high flatness. The reason for this is not clear, but it can be considered that when a resin sheet or a resin composition has high thixotropy, the viscosity in its material is high during storage, and as a result, the occurrence of aggregates is reduced, which improves the flatness of the resin sheet. The good flatness of the resin sheet improves the connection reliability of a semiconductor device.

Specifically, when a resin sheet has a loss tangent differential equal to a greater than 1 as measured at a temperature of 80° C. and a frequency of 0.5 Hz in a dynamic shear stress measurement in a direction parallel to a surface, a semiconductor device manufactured using this resin sheet has good connection reliability. The loss tangent differential is more preferably 1.5 or more. The upper limit of the loss tangent differential is not limited to a particular value, but practically, it is up to 5 in most cases.

In the resin sheet of the present invention, in a dynamic viscoelasticity measurement (measurement in which not a shear strain but a one-dimensional dynamic strain is applied) in a direction parallel to a surface after hardening, the temperature at which the loss tangent is maximum is preferably 160° C. or higher. In the measurement, the strain amplitude is 0.05% of the sheet thickness, and the frequency is 1 Hz. Examples of the apparatus for evaluation include a dynamic viscoelasticity measuring apparatus (DMA) "DVA-200" (trade name, manufactured by Amety Keisoku Seigyo K.K.).

The resin sheet after hardening exhibits an elastic behavior, but as the temperature is increased, the main chain of the resin starts to vibrate at a certain temperature, at which point the loss tangent of the resin sheet is maximum. At or higher than this temperature, the resin sheet after hardening becomes viscous. When the temperature at which the loss tangent is maximum is 160° C. or higher, a semiconductor device manufactured using the resin sheet will have high connection reliability. The reason for this is not clear, but it can be considered that when the temperature at which the loss tangent is maximum is low, the resin sheet after hardening becomes viscous in a connection reliability evaluation involving heating and cooling, such as a thermal cycle test, to thereby cause deformation of a semiconductor device, whereby stresses are concentrated at the resin sheet or metal joint after hardening to cause cracks and fractures, reducing the connection reliability of the semiconductor device, The temperature at which the loss tangent is maximum is more preferably 170° C. or higher.

The resin sheet or the resin composition of the present invention is a semisolid material that exhibits flowability when heated to a temperature at about 100° C. When the resin sheet or the resin composition is further heated to a temperature at about 100° C. or higher, a resin component therein, such as an epoxy compound, is cross-linked to form a network structure, whereby the semisolid material lose flowability to become solid. Such a change of state is referred to as hardening, and the resultant is referred to as a hardened resin sheet or a hardened resin composition. The hardened material once hardened, if cooled to room temperature and then heated again, will not exhibit flowability. The hardening proceeds not only by heating, but may also proceed by irradiation with ultraviolet rays or the like.

The resin sheet of the present invention can be produced by applying a liquid resin composition containing a solvent to an exfoliative substrate, and then removing volatile components such as the solvent.

The resin composition of the present invention contains an epoxy compound (a). The epoxy compound (a) generally hardens through ring opening which is not accompanied by shrinkage, and therefore can reduce the shrinkage of the resin composition during hardening. The epoxy compound (a) is preferably one having more than one epoxy group or one having an epoxy equivalent weight of 100 to 500. An epoxy equivalent weight of 100 or more or more increases the toughness of a hardened resin composition. An epoxy equivalent weight of not more than 500 provides the hardened resin composition with a network structure of high density to improve the insulation properties of the hardened resin composition.

The epoxy compound (a) is preferably a naphthalene skeleton epoxy resin or an anthracene skeleton epoxy resin. The naphthalene skeleton epoxy resin or the anthracene skeleton epoxy resin is an epoxy resin having a naphthalene skeleton or anthracene skeleton epoxy resin, the thixotropy of the resin sheet and the resin composition are advantageously improved. In addition, by containing the naphthalene skeleton epoxy resin or the anthracene skeleton epoxy resin, the hardened resin sheet and the hardened resin composition each form a rigid internal structure, which increases the temperature at which the loss tangent is maximum, and consequently, a semiconductor device manufactured using the same advantageously has improved connection reliability. Examples of the naphthalene skeleton epoxy resin include EPICLON (registered trademark) HP-4032 and EPICLON (registered trademark) HP-4700 (trade names, available from DIG Corporation). Examples of the anthracene skeleton epoxy resin include jER (registered trademark) YX8800 (trade name, available from Mitsubishi Chemical Corporation).

Examples of epoxy compounds include jER (registered trademark) 828, jER (registered trademark) 152, jER (registered trademark) 154, jER (registered trademark) 630, jER (registered trademark) YL980, jER (registered trademark) 1002, jER (registered trademark) 1009, jER (registered trademark) 5050, jER (registered trademark) YX4000, JER (registered trademark) YX4000UH, jER (registered trademark) YX8800 (trade names, available from Mitsubishi Chemical Corporation), EPPN (registered trademark) 502H, NC-3000 (trade names, available from Nippon Kayaku Co., Ltd.), EPICLON (registered trademark) N-695, EPICLON (registered trademark) N-865, EPICLON (registered trademark) HP-4032, EPICLON (registered trademark) HP-4700, EPICLON (registered trademark) HP-7200, EPICLON (registered trademark) HP-7200H (trade names, available from DIC Corporation), Aronix (registered trademark) M-215, Aronix (registered trademark) M-315 (trade names, available from Toagosei Co., Ltd.), and Epolite 1500NP, Epolite 4000 (trade names, available from Kyoeisha Chemical Co., Ltd.), but are not limited thereto. These may be used in combination of two or more.

The epoxy compound (a), when the temperature is increased in order to harden the resin sheet of the present invention, influences its viscoelastic behavior. As the temperature is increased from room temperature, the resin sheet softens to become less viscous, but the viscosity reaches the lowest point at around 100° C. and increases at higher than this temperature. This is because the epoxy compound (a) in the resin sheet starts to harden. The lowest viscosity at this point is referred to as a minimum melt viscosity of the resin sheet. For example, when a semiconductor chip is bonded to a circuit board via the resin sheet, a bump electrode formed on the semiconductor chip and a pad electrode on the circuit board displace the resin sheet whereby the bump electrode and the pad electrode come into contact to provide electrical connection. When the minimum melt viscosity of the resin sheet is sufficiently low, electrodes on a semiconductor chip and a circuit board can easily displace the resin sheet when the semiconductor chip is bonded to the circuit board via the resin sheet, and the opposing electrodes come into good contact. Consequently, the electrical connection of the electrodes as well as the bonding of the semiconductor chip to the circuit board is secured, and the electrical connection reliability is advantageously improved. When the temperature at which the melt viscosity is minimal is 100° C. or higher, the resin sheet advantageously has improved storage stability because the resin sheet can hardly be hardened when stored at a temperature of 100° C. or lower.

The resin composition of the present invention contains a microcapsule type hardening acceleration agent (b). The microcapsule type hardening acceleration agents include a hardening acceleration agent as a core component and a microcapsule encapsulating the agent. The microcapsule type hardening acceleration agent (b), in which a hardening acceleration agent is protected by a microcapsule, inhibits the epoxy compound (a) from hardening in a temperature range of 100° C. or lower to improve the storage stability of the resin composition.

Examples of the core component of the microcapsule type hardening acceleration agent (b) include dicyandiamide type hardening acceleration agents, amine adduct type hardening acceleration agents, organic acid hydrazide type hardening acceleration agents, and aromatic sulfonium salt type hardening acceleration agents. Examples of the microcapsule encapsulating the core component include vinyl compounds, urea compounds, isocyanate compounds, and thermoplastic resins.

The amount of the microcapsule type hardening acceleration agent (b) is preferably 0.1 to 50 parts by weight based on 100 parts by weight of the epoxy compound (a). The microcapsule type hardening acceleration agent (b) in an amount of 0.1 parts by weight or more based on 100 parts by weight of the epoxy compound (a) increases the connection reliability of a semiconductor device manufactured using the resin composition. The microcapsule type hardening acceleration agent (b) in an amount of 10 parts by weight or more based on 100 parts by weight of the epoxy compound (a) is more preferred because it allows the resin composition to harden in a short time even at a low temperature. The hardening temperature and the hardening time are, for example, 160° C. to 200° C. for 5 seconds to 20 minutes, but are not limited thereto. The microcapsule type hardening acceleration agent (b) in an amount of 50 parts by weight or more based on 100 parts by weight of the epoxy compound (a) increases the storage stability of the resin composition at 100° C. or lower. Furthermore, the water absorbency of a hardened resin composition is reduced to provide high strength, and high toughness, and a semiconductor device manufactured using this resin composition will have improved connection reliability.

As the microcapsule type hardening acceleration agent (b), one which is not dissolved by components contained in the resin composition is preferable used. Specific examples of the microcapsule type hardening acceleration agent (b) that is preferably used include NOVACURE (registered trademark) HX-3941-HP, NOVACURE (registered trademark) HX-3922HP, NOVACURE (registered trademark) HX-3932HP, and NOVACURE (registered trademark) HX-3042HP (trade names, available from Asahi Kasei E-materials Corporation), which are microcapsule type hardening acceleration agents in which an amine adduct type hardening acceleration agent is encapsulated by an isocyanate compound.

As the microcapsule type hardening acceleration agent (b), a hardening acceleration agent composition, which is present dispersed in a liquid epoxy compound, can be used. For example, NOVACURE (registered trademark) (trade name, available from Asahi Kasei E-materials Corporation), series, which are commercially available microcapsule type hardening acceleration agents, are marketed as hardening acceleration agent compositions each containing an epoxy compound in an amount of 200 parts by weight based on 100 parts by weight of the microcapsule type hardening acceleration agent (b). Therefore, when NOVACURE (registered trademark) series are used as the microcapsule type hardening acceleration agent (b), it is necessary, in calculation of the amount of each component in the resin composition, to include the epoxy compound contained in the hardening acceleration agent composition in the epoxy compound (a). Thus, the total weight of the hardening acceleration agent composition minus the weight of the epoxy compound contained therein is the weight of the microcapsule type hardening acceleration agent (b).

The dispersion particle diameter of the microcapsule type hardening acceleration agent (b) is preferably 0.5 to 5 μm. The dispersion particle diameter as used herein refers to an average particle diameter of the microcapsule type hardening acceleration agents (b) existing spatially separated from each other. When the shape of the microcapsule type hardening acceleration agent (b) is spherical, the diameter thereof is used as the dispersion particle diameter, and when the shape is oval or flat, the maximum length of the particles is used as the dispersion particle diameter. When the shape is rod-like or fibrous, the maximum length in the longitudinal direction is used as the dispersion particle diameter.

Furthermore, reducing the difference between the refractive index of a medium composed of the epoxy compound (a) and other constituent materials and the refractive index of the microcapsule type hardening acceleration agent (b) can improve the light transmittance of the resin composition or the resin sheet.

In addition to the microcapsule type hardening acceleration agent (b), any other hardening acceleration agent may be used. Specific examples of other hardening acceleration agents include amine type hardening acceleration agents, phosphine type hardening acceleration agents, phosphonium type hardening acceleration agents, sulfonium type hardening acceleration agents, and iodonium type hardening acceleration agents.

The resin composition of the present invention contains inorganic particles (c). By containing the inorganic particles, the thixotropy of the resin sheet is improved, and consequently, a semiconductor device manufactured using the resin sheet will have high connection reliability. In addition, the coefficient of linear expansion of a hardened resin composition is reduced to approach the coefficients of linear expansion of a semiconductor chip and a circuit board, and consequently, a semiconductor device manufactured using the resin composition will have high connection reliability.

As the material of the inorganic particles (c), silica, alumina, titania, silicon nitride, boron nitride, aluminum nitride, iron oxide, glass, and other metal oxides and metal nitrides, metal carbonates, metal sulfates such as barium sulfate, and the like can be used alone or in combination of two or more. Of these, silica can be particularly preferably used m terms of low thermal expansibility, low water absorbency, and high dispersibility.

The surface of the inorganic particles (c) is preferably modified by a compound such as a silane coupling agent because the dispersibility of the inorganic particles (c) in the resin composition or the resin sheet is improved. When the surface of the inorganic particles is modified by a specific compound, it means that at a part or all of the particle surface, the compound is bonded to an atom on the particle surface via a covalent bond, an ionic bond, or the like. For example, when a silane coupling agent as listed below is used as a compound for surface modification, a hydroxyl group on the particle surface and a silanol group of the silane coupling agent form a covalent bond through dehydration condensation.

Examples of silane coupling agents include vinyltrimethoxysilane, vinyltriethoxysilane, 3-glycidoxypropyltrimethoxysilane, 3-glycidoxypropyltriethoxysilane, 3-acryloxypropyltrimethoxysilane, 3-acryloxypropyltriethoxysilane, 3-methacryloxypropyltrimethoxysilane, 3-methacryloxypropyltriethoxysilane, N-2 (aminoethyl)3-aminopropyltrimethoxysilane, N-2(aminoethyl)3-aminopropyltriethoxysilane, N-phenyl-3-aminopropyltrimethoxysilane, 3-isocyanatepropyltriethoxysilane, and 3-mercaptopropyltrimethoxysilane.

In particular, when the surface of the inorganic particles (c) is modified by a compound having an acryloxy group or a methacryloxy group, the inorganic particles (c) is dispersed well in the presence of an epoxy compound, and the resin sheet has a low minimum melt viscosity; consequently, a semiconductor device manufactured using the same will have improved connection reliability. Among the silane coupling agents listed above, 3-acryloxypropyltriethoxysilane, 3-methacryloxypropyltrimethoxysilane, and 3-methacryloxypropyltriethoxysilane are preferably used.

For the amount of the inorganic particles (c), the amount based on the solid content in the resin composition, that is, the amount of all the components in the resin composition excluding volatile components such as solvent is preferably 40 to 70% by weight. When the amount of the inorganic particles (c) is 40% by weight or more, foaming is less likely to occur when the resin composition is hardened by heating, and the coefficient of linear expansion of a hardened resin composition becomes low, and consequently, a semiconductor device manufactured using the resin composition will have high connection reliability. Particularly when the semiconductor device is subjected to a treatment where higher durability is required, such as a moisture absorption/reflow treatment and a thermal cycle treatment, good connection reliability can be maintained.

When the amount of the inorganic particles (c) is 70% by weight or less, the minimum melt viscosity of the resin composition is less likely to increase, and the inorganic particles (c) are uniformly dispersed in the resin composition; consequently, a resin sheet free of thickness irregularities, pinholes, cracks, or the like is provided when the resin composition is applied in the form of a sheet. Consequently, a semiconductor device manufactured using this resin sheet will have high connection reliability. Furthermore, the uniform dispersion of the inorganic particles (c) improves the light transmittance of the resin sheet.

The shape of the inorganic particles (c) may be either spherical or nonspherical, e.g., granular or flake-like, and the inorganic particles (c) of spherical shape can be preferably used because they are likely to be dispersed uniformly in the resin composition.

The dispersion particle diameter of the inorganic particles (c) is preferably 300 nm or less, more preferably 1 to 300 nm. When the dispersion particle diameter is 1 nm or more, the resin composition has a low minimum melt viscosity, which improves the surface flatness of the resin sheet after molding, leading to good bonding of a semiconductor chip and a circuit board. The dispersion particle diameter of the inorganic particles (c) is preferably 10 nm or more. When the dispersion particle diameter is 300 nm or less, the resin sheet has improved thixotropy, and consequently, a semiconductor device manufactured using the resin sheet will have high connection reliability. Furthermore, the resin sheet has high light transmittance, which improves the visibility of alignment marks on a semiconductor chip and a circuit board, at the adherence surface of which the resin sheet is formed. The dispersion particle diameter of the inorganic particles (c) is more preferably 200 nm or less, most preferably 100 nm or less.

The dispersion particle diameter of the inorganic particles (c) refers to an average particle diameter of the inorganic particles (c) existing spatially separated from each other. When the shape of the particles is spherical, the diameter thereof is used as the dispersion particle diameter, and when the shape is oval or flat, the maximum length of the particles is used as the dispersion particle diameter. When the shape of the particles is rod-like or fibrous, the maximum length in the longitudinal direction is used as the dispersion particle diameter. When a plurality of particles is aggregated to form one particle, the maximum length of the aggregated particles is used as the dispersion particle diameter.

The dispersion particle diameter of the inorganic particles (c) in the resin composition or the resin sheet can be measured by directly observing the particles under a SEM (scanning electron microscope) and averaging the diameters of 100 particles. The dispersion particle diameter of the inorganic particles in a dispersion can be measured using, for example, a dynamic light scattering-type particle diameter analyzer "Zetasizer Nano ZS" (trade name) manufactured by Sysmex Corporation.

The resin composition of the present invention contains a compound (d) represented by Formula (1). The compound (d) is hereinafter referred to as a diketone compound A.

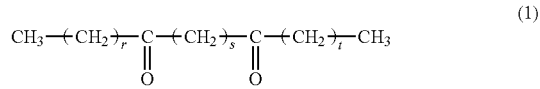
(1)

In the above Formula (1), r, s, and t each represent an integer of 0 to 2.

By containing the diketone compound A (d), the occurrence of aggregates during storage of the resin composition is reduced. Although the principle of the occurrence of aggregates is uncertain, it was found that aggregates occur on the air contacting surface of the resin composition in a container, and the occurrence of aggregates significantly increases when the resin composition is heated. From this fact it is presumed that the solvent volatilizes into air near the surface of the resin composition to result in an area where the solvent is locally insufficient and in this area, the composition contained in the resin composition aggregates to precipitate as a solid.

The amount of the diketone compound A (d) is preferably 0.1 to 10% by weight based on the total amount of the resin composition including the solvent. When the amount is 0.1% by weight or more, the occurrence of aggregates during storage of the resin composition is reduced. When the amount is 10% by weight or less, hardening of the epoxy compound (a) in the resin composition can be prevented, and the storage stability of the resin composition can be improved.

Examples of the diketone compound A (d) include diacetyl, acetylacetone, 2,3-pentanedione, 2,3-hexanedione, 3,4-hexanedione, 2,5-hexanedione, 2,6-heptanedione; and 3,5-heptanedione, among which acetylacetone is preferred.

Preferably, the resin composition of the present invention further contains a compound (e) having a group (e1) selected from acryloxy and methylacryloxy and a group (e2) selected from carboxyl and hydroxyl to increase the fracture elongation of a hardened resin composition. This compound (e) is hereinafter referred to as acidic acrylate.

For the amount of the acidic acrylate, the amount based on the solid content in the resin composition, that is, the amount of all the components in the resin composition excluding volatile components such as solvent is preferably 0.1% to 5% by weight. When the amount is 0.1% by weight or more, the fracture elongation of a hardened resin composition increases. When the amount is 5% by weight or less, the resin composition has improved storage stability at 100° C. or lower.

Examples of acidic acrylates include 2-hydroxyethyl acrylate, 2-hydroxyethyl methacrylate, 2-hydroxypropyl acrylate, 2-hydroxypropyl methacrylate, 2-hydroxybutyl acrylate, 2-acryloxyethyl succinate, 2-acryloxyethyl phthalate, 2-acryloxyethyl hexahydrophthalate, 2-acryloxyethyl-2-hydroxyethyl phthalate, 2-hydroxy-3-phenoxypropyl acrylate, and 2-hydroxy-3-acryloxypropyl methacrylate. Examples of commercially available acidic acrylates include HOA-MS, HOA-MPL, HOA-MPE, Epoxy Ester 3000A, Epoxy Ester 3002A, TATH05 (Formula (2) below) (trade names, available from Kyoeisha Chemical Co., Ltd.). and KAYARD (registered trademark) ZAR1395H, KAYARD (registered trademark) ZFR1401H (trade names, available from Nippon Kayaku Co., Ltd.).

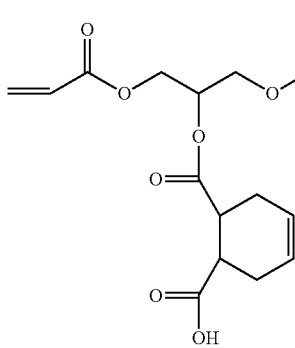
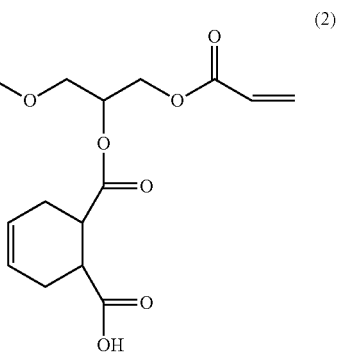

(2)

Preferably, the resin composition of the present invention further contains an organic solvent-soluble polyimide having an imide ring to exhibit good heat resistance and chemical resistance. In particular, an organic solvent-soluble polyimide having on its side chain at least one functional group reactive with epoxy promotes the ring opening and addition reaction to the polyimide of an epoxy compound during heating for hardening the resin composition, and provides a hardened resin composition having a network structure of even higher density. Examples of the functional group reactive with epoxy include phenolic hydroxyl, sulfonic, and thiol. Examples of the method of synthesizing such a polyimide include, but are not limited to, a method in which an acid dianhydride having a group reactive with epoxy and a diamine are first reacted to synthesize a polyimide precursor, and the polyimide precursor was end-modified using a primary monoamine as end-capping agent, and then heated at 150° C. or higher to cause polyimide cyclization. Other methods include a method in which an acid dianhydride is reacted in advance with a primary monoamine, an end-capping agent; a diamine is added to synthesize an end-modified polyimide precursor; and then the end-modified polyimide precursor is further heated at 150° C. or higher to cause polyimide cyclization.

One preferred example of the organic solvent-soluble polyimide is a polymer having a structure represented by either Formula (4) or Formula (5) below. More preferred is a polymer containing a structure represented by Formula (3) as $R^4$ in Formula (4) or (5) in an amount of 5 to 15% by weight based on the total amount of the polymer. When the amount of the structure represented by Formula (3) is 5% by weight or more, the polyimide can exhibit moderate flexibility, and when the amount is 15% by weight or less, the stiffness, heat resistance, and insulation properties of the polyimide are maintained.

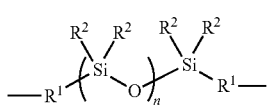

(3)

In the Formula, $R^1$ is a divalent hydrocarbon group. $R^1$ is preferably a $C_1$-$C_5$ alkylene group or a phenylene group. $R^2$ is a monovalent hydrocarbon group. $R^2$ is preferably a $C_1$-$C_5$ alkyl group or a phenyl group. The organic solvent-soluble polyimide may contain in one molecule $R^1$ and $R^2$ each having a different structure. Alternatively, the organic solvent-soluble polyimide may contain in different molecules $R^1$ and $R^2$ each having a different structure. n represents an integer of 1 to 10, and is preferably 1 to 2. When n is equal to or greater than 1, the resin composition is less likely to shrink during hardening, and when n is equal to or less than 10, the imide content in the polyimide skeleton is high, which improves the insulation properties and heat resistance of a hardened resin composition.

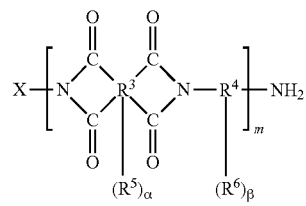

(4)

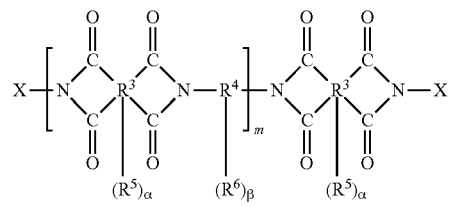

(5)

In the Formula, $R^3$ is a 4- to 14-valent organic group, and $R^4$ is a 2- to 12-valent organic group. At least one of $R^3$ and $R^4$ is an aromatic group containing at least one group (which is hereinafter referred to as "specific group") selected from the group consisting of 1,1,1,3,3,3-hexafluoropropyl, isopropyl, ether, thioether, and $SO_2$. $R^5$ and $R^6$ each represent a group selected from the group consisting of phenolic hydroxyl, sulfonic, and thiol. The organic solvent-soluble polyimide may contain in one molecule $R^3$ to $R^6$ each having a different structure, or the organic solvent-soluble polyimide may contain in different molecules $R^3$ to $R^6$ each having a different structure. X represents a monovalent organic group. m is 8 to 200, preferably 10 to 150. α and β each represent an integer of 0 to 10, and α=β is an integer of 0 to 10, provided that α+β=1 to 10 for 20 to 90% of repeating units.

"Soluble" in the organic solvent-soluble polyimide means being soluble in an amount of 20% by weight or more at 23° C. in at least one solvent selected from the following: ketone solvents such as acetone, methyl ethyl ketone, methyl isobutyl ketone, cyclopentanone, and cyclohexanone; ether solvents such as 1,4-dioxane, tetrahydrofuran, and diglyme; glycol ether solvents such as methyl Cellosolve, ethyl Cellosolve, propylene glycol monomethyl ether, propylene glycol monoethyl ether, propylene glycol monobutyl ether, and diethylene glycol methyl ethyl ether; and other solvents, such as benzyl alcohol, N-methylpyrrolidone, γ-butyrolactone, ethyl acetate, and N,N-dimethylformamide.

In Formula (4) and (5), $R^3$ represents a residue of acid dianhydride, and is preferably a 4- to 14-valent organic group having 5 to 40 carbon atoms. $R^4$ represents a residue of diamine, and is preferably a 2- to 12-valent organic group having 5 to 40 carbon atoms. Both of $R^3$ and $R^4$ preferably contain at least one of the specific groups described above.

X is a group derived from a primary monoamine, an end-capping agent. X may be a single group or a combination of two or more groups. Specific examples of primary monoamines include 5-aminoqiunoline, 4-aminoquinoline, 3-aminonaphthalene, 2-aminonaphthalene, 1-aminonaphthalene, and aniline. Of these, aniline is particularly preferably used. The amount of the X component in the polymer is preferably in the range of 0.1 to 60 mol %, particularly preferably 5 to 50 mol %, based on the total amount of diamine components.

The structure of Formula (3) and the end-capping agent introduced into the polymer can be easily detected and quantitatively determined by the following method. For example, the structure of Formula (3) and the end-capping agent can be easily detected and quantitatively determined in such a manner that the polymer into which the structure of Formula (3) and the end-capping agent are introduced is dissolved in an acidic solution or a basic solution and decomposed into polymer constituents, diamine components and acid anhydride components, and these components are subjected to a measurement using gas chromatography (GC) or NMR. Alternatively, the structure of Formula (3) and the end-capping agent can be easily detected and quantitatively determined in such a manner that the polyimide into which the end-capping agent is introduced is directly subjected to a measurement using pyrolysis gas chromatography (PGC), or using infrared spectra and $^{13}C$-NMR.

The organic solvent-soluble polyimide may be composed only of the structure represented by Formula (4) and (5), or may be a copolymer or mixture containing any other structure. The structure represented by Formula (4) and (5) is preferably contained in an amount of 50 mol % or more based on the total amount of the organic solvent-soluble polyimide. The type and amount of the other structure used for the copolymer or mixture is preferably selected without impairing the heat resistance of a hardened resin composition obtained by heat treatment.

The organic solvent-soluble polyimide is synthesized using any known method. Examples include a method in which a tetracarboxylic dianhydride and a diamine compound are reacted at a low temperature, a method in which a diester is formed by the reaction between a tetracarhoxyiic dianhydride and an alcohol, and then reacted in the presence of a diamine and a condensing agent, and a method in which a diester is formed by the reaction between a tetracarboxylic dianhydride and an alcohol, and then a polyinide precursor is formed using, for example, a method in which the residual dicarboxylic acid is acid-chlorinated and reacted with a diamine, which polyimide precursor is then subjected to a known imidization reaction.

Acid dianhydrides that can be used will be described. Specific examples of the acid dianhydride having at least one of the specific groups described above include 2,2-bis(3,4-dicarboxyphenyl)propane dianhydride, 2,2-bis(2,3-dicarboxyphenyl)propane dianhydride, bis(3,4-dicarboxyphenyl)sulfone dianhydride, bis(3,4-dicarboxyphenyl) ether dianhydride, 2,2-bis(3,4-dicarboxyphenyl)hexafluoropropane dianhydride, and derivatives thereof each having an alkyl substituent or a halogen substituent on its aromatic ring.

Furthermore, other acid dianhydrides, specifically, aromatic tetracarboxylic dianhydrides such as pyromellitic dianhydride, 3,3',4,4'-biphenyltetracarboxylic dianhydride, 2,3,3',4'-biphenyltetracarboxylic dianhydride, 2,2',3,3'-biphenyltetracarboxylic dianhydride, 3,3',4,4'-benzophenonetetracarboxylic dianhydride, 2,2',3,3'-benzophenonetetracarboxylic dianhydride, 1,1-bis(3,4-dicarboxyphenyl)ethane dianhydride, 1,1-bis(2,3,-dicarboxyphenyl)ethane dianhydride, bis(3,4-dicarboxyphenyl)methane dianhydride, bis(2,3-dicarboxyphenyl)methane dianhydride, 1,2,5,6-naphthalenetetracarboxylic dianhydride, 2,3,6,7-naphthalenetetracarboxylic dianhydride, 2,3,5,6-pyridinetetracarboxylic dianhydride, and 3,4,9,10-perylenetetracarboxylic dianhydride, derivatives thereof each having an alkyl substituent or a halogen substituent on its aromatic ring can also be used. These acid dianhydrides are used alone or in combination of two or more.

Diamines that can be used will be described. Specific examples of the diamine having at least one of the specific groups described above include 3,4'-diaminodiphenylsulfide, 4,4'-diaminodiphenylsulfide, 3,4'-diaminodiphenyl ether, 4,4'-diaminodiphenyl ether, 3,4'-diaminodiphenylsulfone, 4,4'-diaminodiphenylsulfone, bis[4-(4-aminophenoxy)phenyl]sulfone, bis[4-(3-aminophenoxy)phenyl]sulfone, bis(4-aminophenoxy)biphenyl, bis[4-(4-aminophenoxy)phenyl]ether, 1,4-bis(4-aminophenoxy)benzene, 1,3-bis(4-aminophenoxy) benzene, 2,2-bis[4-(4-aminophenoxy)phenyl]hexafluoropropane, 2,2-bis[4-(4-aminophenoxy)phenyl]propane, and derivatives thereof each having an alkyl substituent or a halogen substituent on its aromatic ring.

Specific examples of the diamine having at least one of the specific groups described above and at least one group selected from the group consisting of phenolic hydroxyl, sulfonic, and thiol include 2,2-bis(3-amino-4-hydroxyphenyl)hexafluoropropane, 2,2-bis(3-hydroxy-4-aminophenyl)hexafluoropropane, 2,2-bis(3-amino-4-hydroxyphenyl)propane, 2,2-bis(3-hydroxy-4-aminophenyl)propane, 3,3'-diamino-4,4'-dihydroxydiphenyl ether, 3,3'-diamino-4,4'-dihydroxydiphenylsulfone, 3,3'-diamino-4,4'-dihydroxydiphenyfsulfide, and derivatives thereof each having an alkyl substituent or a halogen substituent on its aromatic ring.

Furthermore, other diamines, specifically, 3,3'-diamino-4,4'-dihydroxybiphenyl, 2,4-diamino-phenol, 2,5-diaminophenol, 1,4-diamino-2,5-dihydroxybenzene, diaminodihydroxypyrimidine, diaminodihydroxypyridine, hydroxydiaminodihydroxypyrimidine, 9,9-bis(3-amino-4-hydroxyphenyl)fluorene, 3,4'-diaminodiphenylmethane, 4,4'-diaminodiphenylmethane, benzidine, m-phenylenediamine, p-phenylenediamine, 1,5-naphthalenediamine, 2,6-naphthalenediamine, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',5,5'-tetramethyl-4,4'-diaminobiphenyl, 2,2'di(-trifluoromethyl)-4,4'-diaminobiphenyl or derivatives thereof each having an alkyl substituent or a halogen substituent on its aromatic ring, 2,6-naphthalenedicarboxylic acid dihydrazide, 4,4'-bisphenyl dicarbonohydrazine, 4,4'-cyclohexane dicarbonohydrazine, or hydrazide derivatives thereof each having an alkyl substituent or a halogen substituent on its aromatic ring can also be used. These diamines are used alone or in combination of two or more.

Examples of the diamine containing the structure represented by Formula (3) include bis(3-aminopropyl)tetramethyldisiloxane and bis(p-amino-phenyl)octamethylpentasiloxane.

The amount of the organic solvent-soluble polyimide based on 100 parts by weight of the amount of the components in the resin composition excluding the solvent and the inorganic particles is preferably 10 to 20 parts by weight. The organic solvent-soluble polyimide in an amount of 10 parts by weight or more improves the heat resistance of a hardened resin composition. The organic solvent-soluble polyimide in an amount of 20 parts by weight or less reduces the water absorbency of the hardened resin composition, which increases the adhesion force between a circuit board and a semiconductor chip to result in improved connection reliability. In addition, the insulation properties of the hardened resin composition are improved. Furthermore, when the amount of the organic solvent-soluble polyimide is 10 to 20 parts by weight, the resin sheet has a low minimum melt viscosity, and the temperature at this time is advantageously high.

The resin composition of the present invention may further contain a thermoplastic resin for the purpose of reducing the stress in the sate of being hardened. Examples of thermoplastic resins include phenoxy resins, polyesters, polyurethanes, polyamides, polyproylene, acrylonitrile-butadiene copolymer (NBR), styrene-butadiene copolymer (SBR), acrylonitrile-butadiene-methacrylic acid copolymer, and acrylonitrile-butadiene-acrylic acid copolymer, but are not limited thereto.

The resin composition of the present invention may contain a compound for improving thixotropy. Examples of the compound for improving thixotropy include surfactants that are based on polyether, polyester, and the like, and thixotropy enhancing agents that are based on amide, fatty acid amide, urea, and the like. Specific examples include BYK (registered trademark) 405, BYK (registered trademark) 410, BYK (registered trademark) 411 (trade names, available from BYK-Chemie Japan), and DISPARLON (registered trademark) 3600N, DISPARLON (registered trademark) 3900EF, DISPARLON (registered trademark) 6900-10X (trade names, available from Kusumoto Chemicals, Ltd.).

The resin composition of the present invention may contain a solvent. As the solvents, ketone solvents such as acetone, methyl ethyl ketone, methyl isobutyl ketone, cyclopentanone, and cyclohexanone; ether solvents such as 1,4-dioxane, tetrahydrofuran, and diglyme; glycol ether solvents such as methyl Cellosolve, ethyl Cellosolve, propylene glycol monomethyl ether, propylene glycol monoethyl ether, propylene glycol monobutyl ether, propylene glycol monoethyl ether acetate, propylene glycol monoethyl ether acetate, and diethylene glycol methyl ethyl ether; and other solvents, such as benzyl alcohol, N-methylpyrrolidone, γ-butyrolactone, ethyl acetate, and N,N-dimethylformamide can be used alone or in combination of two or more, but these are not limiting examples.

One example of the method of producing the resin composition and the resin sheet of the present invention will now be described in detail.

First, an epoxy compound (a), a microcapsule type hardening acceleration agent (b), inorganic particles (c), a diketone compound A (d), an acidic acrylate (e), an organic solvent-soluble polyimide, a solvent, a polymerization inhibitor, a plasticizer, a surfactant, a leveling agent, an ion scavenger, a silane coupling agent, and the like are mixed to prepare a resin composition.

As the inorganic particles (c), those in the form of powder of aggregated primary particles may be used, or a dispersion of the inorganic particles (c) may be used.

When the surface of the inorganic particles (c) is modified with a compound such as a silane coupling agent, the modification is carried out, for example, as described below. The inorganic particles (c) in form of powder of aggregated primary particles are mixed with a solvent, and using a dispersing apparatus such as a homogenizer, a ball mill, or a bead mill, the aggregated inorganic particles (c) are loosened or crushed to be dispersed in the solvent. Subsequently, to the resulting dispersion of the inorganic particles (c), a compound for surface modification, such as a silane coupling agent, are added and stirred at room temperature or a temperature of 100° C. or lower for several hours to prepare a dispersion of the surface-modified inorganic particles (c). Before dispersing the inorganic particles (c), the compound for surface modification may be mixed with the solvent in advance to carry out the dispersion treatment and the surface treatment of the inorganic particles (c) at the same time. In addition, other compounds such as dispersants and antifoaming agents can also be added. The dispersion of the surface-modified inorganic particles (c) may be used as it is to prepare a resin composition, or powder of the inorganic particles obtained by removing the solvent from the dispersion using a rotary evaporator or the like may be used to prepare a resin composition.

For the above mixing of the materials, an apparatus such as a homogenizer, a ball mill, or a bead mill can be used. As the microcapsule type hardening acceleration agent (b) can be ruptured during the mixing to harden the epoxy compound (a), preferably, the microcapsule type hardening acceleration agent (b) is added after other materials are added, and mixed with a relatively weak force.

The resin composition obtained as described above is then applied to an exfoliative substrate, and then the volatile components are removed, whereby a resin sheet can be obtained. Specifically, the resin composition is first applied to an exfoliative substrate using an apparatus such as a bar coater, a screen printer, a blade coater, a die coater, or a comma coater, and then the solvent is removed to provide a resin sheet. Examples of exfoliative substrates include polyethylene terephthalate films, polyethylene naphthalate films, polyester films, polyvinyl chloride films, polycarbonate films, polyimide films, fluororesin films such as polytetrafluoroethylene films, polyphenylene sulfide films, polypropylene films, and polyethylene films, but are not limited thereto. The exfoliative substrate may be surface-treated with a mold releasing agent that is based on silicone, long-chain alkyl, fluorine, aliphatic amide, or the like. The thickness of the exfoliative substrate is not critical, and typically, the thickness of 5 to 75 μm is preferred.

The removal of volatile components such as the solvent is preferably carried out by heat treatment. Examples of the heat treatment include heating with an oven or a hotplate, vacuum drying, and heating by electromagnetic waves such as infrared rays or microwaves. If the solvent is removed insufficiently, when the resin sheet is hardened by heating at an even higher temperature after a semiconductor chip and a circuit board are bonded via the resin sheet, air bubbles can occur to reduce the adhesion force. On the other hand, if the heating for removing the solvent is excessive, the hardening of the resin sheet can proceed to reduce the adhesion force.

On the surface of the resin sheet obtained opposite to the surface having the exfoliative substrate, another exfoliative substrate is preferably laminated such that the resin sheet is sandwiched between the two exfoliative substrates. The material and the thickness of the other exfoliative substrate may be the same as previously described. The two exfoliative substrates may be the same. However, adhesion forces between each exfoliative substrate and the resin sheet are preferably different. In particular, the difference in adhesion force is preferable 5 to 47 N/m. A difference in adhesion force of 5 N/m or more prevents the resin sheet, when the exfoliative substrate with a smaller adhesion force is peeled off, from peeling or lifting off the other exfoliative substrate. A difference in adhesion force of 47 N/m or less makes the resin sheet less likely to remain on the surface of each peeled exfoliative substrate. The adhesion force of the exfoliative substrate to which the resin composition is applied first may be larger or smaller than the adhesion force of the exfoliative substrate laminated later.

The minimum melt viscosity of the resin sheet is preferably in the range of 10 to 10000 Pa·s. A more preferred range of the minimum melt viscosity is 100 to 5000 Pa·s. A minimum melt viscosity in this range improves the connection between the electrodes described above, allows the resin sheet to be laminated to a semiconductor wafer and a circuit board without causing wrinkles or entraining air bubbles, and further reduces the squeeze-out of the resin sheet in packaging of a semiconductor chip. The minimum melt viscosity of the resin sheet can be measured using a sample having a diameter of 15 mm and a thickness of 0.8 mm, for example, with a rheometer "AG-G2" (trade name, manufactured by TA Instruments) under the conditions of a measuring frequency of 0.5 Hz, a temperature rise rate of 2° C./min, and a measuring temperature range from 40° C. to 150° C.

The method of manufacturing a semiconductor device including the resin composition of the present invention will be described. The method of manufacturing a semiconductor device according to the present invention is a method of manufacturing a semiconductor device in which the resin composition of the present invention is interposed between a first circuit component and a second circuit component and. the first circuit component and the second circuit component are electrically connected through the application of heat and pressure. As the resin composition of the present invention, the resin sheet obtained by the production method of the present invention is preferably used.

Specifically, a first circuit component having a first electrode and a second circuit component having a second electrode are first disposed such that the first electrode and the second electrode are opposed to each other. Between the first circuit component and the second circuit component oppositely disposed, the resin composition of the present invention is interposed. The resin composition may be interposed by applying the resin composition directly to the surfaces of the circuit components and then removing volatile components, or by laminating the resin sheet of the present invention on the surfaces of the circuit components. The resin composition may be formed on the electrode-side surface of only one of the circuit components, or may be formed on the electrode-side surfaces of both of the first and the second circuit components. These are then heated and pressurized to bond the first circuit component and the second circuit component and, at the same time, electrically connect the first electrode and the second electrode oppositely disposed. The electrical connection of the electrodes may be via mechanical pressing or via metal joining using, for example, solder Furthermore, a through-electrode may be formed through the first circuit component and/or the second circuit component to form an electrode on one or both surfaces of the circuit components.

An example where the resin sheet is used will be described below. By using this method, the gap between a semiconductor chip and a wiring-patterned circuit board can be sealed with a hardened resin composition.

First, the resin sheet is cut to a predetermined size and laminated on the wiring pattern surface of the wiring-patterned circuit board. Alternatively, a semiconductor chip to which the resin sheet is attached may be produced by laminating die resin sheet to the bump-formed surface of a semiconductor wafer before being cut into semiconductor chips, mid then dicing the semiconductor wafer into pieces. The lamination of the resin sheer can be carried out using a laminating device such as a roll laminator or a vacuum laminator.

After the resin sheet is laminated to the circuit board or the semiconductor chip, the semiconductor chip is mounted to the circuit board using a bonding device. The bonding conditions are not critical as long as good electrical connection can be achieved, but in order to harden the resin sheet, the bonding is preferably carried out under the heat and pressure conditions at a temperature of 100° C. or higher and a pressure of 1 mN/bump or more for 0.1 second or longer. The bonding temperature is more preferably 120° C. to 300° C., still more preferably 150° C. to 250° C. The bonding pressure is more preferably 5 mN/bump to 50000 mN/bump, still more preferably 10 mN/bump to 10000 mN/bump. The bonding time is more preferably 1 second to 60 seconds, still more preferably 2 seconds to 30 seconds. In the bonding, it is also preferable to perform temporary, press-bonding by contacting bumps on the semiconductor chip with a pad electrode on the circuit board through the application of heat and pressure at a temperature of 50° C. or higher and a pressure of 1 mN/bump or more for 0.1 second or longer, and then perform the bonding under the above conditions. After the bonding is performed, the circuit board provided with the semiconductor chip may optionally be heated at a temperature of 50° C. to 200° C. for 10 seconds to 24 hours.

To obtain a semiconductor device with high connection reliability, it is preferred that no air bubbles be present in the resin composition after the bonding. To obtain such a semiconductor device, it is advantageous to apply high pressure to the semiconductor chip during the bonding. When high pressure is applied to the semiconductor chip, however, breakage of the semiconductor chip is caused, and therefore bonding at high pressure has not conventionally been performed. When the resin sheet or the resin composition of the present invention was used, it was confirmed that even if bonding was performed at a high pressure of 200 N or more, breakage of the semiconductor chip did not occur, and air bubbles in the resin composition were removed. The reason for this is not clear, but presumably, when the resin sheet or the resin composition of the present invention was used, the pressure applied to the semiconductor chip was exerted not locally on one part of the semiconductor chip but uniformly, whereby breakage of the semiconductor chip did not occur. However, even if breakage of the semiconductor chip is not observed, the pressure during the bonding is preferably not higher than 500 N to prevent a defective internal structure of a semiconductor device.

The resin sheet and the resin composition of the present invention can be suitably used for bonding, fixing, or sealing circuit components constituting a semiconductor device.

They can also be used for an insulating layer, a permanent resist, a solder resist, a sealant, and the like constituting a circuit board such as a build-up multilayer board, and for an etching resist and the like used for manufacturing a semiconductor device. "Circuit component" as used herein refers to components of a semiconductor device, such as a semiconductor chip, chip parts, a circuit board, or a metal wire material. Specific examples of circuit components include chip parts such as semiconductor chips having bumps such as plated bumps or stud bumps formed thereon, resistor chips, and capacitor chips; semiconductor chips having a through-silicon-via (TSV) electrode; and silicon interposers. "Semiconductor device" as used herein refers to all the devices that can function by using the properties of semiconductor elements, and semiconductor circuits and electronic devices are all included in the semiconductor device.

Furthermore, in addition to the above, the resin sheet and the resin composition of the present invention can be used as a resin composition for producing a die attach film, a dicing die attach film, lead frame fixing tape, an adhesive for radiator plates, reinforcing plates, and shielding materials, a solder resist and the like.

EXAMPLES

The present invention will now be described with reference to examples, but these examples are not intended to limit the present invention.

Method of Measuring Minimum Melt Viscosity of Resin Sheet

The viscoelasticity property of a resin sheet was measured using a rheometer "AG-G2" (trade name, manufactured by TA Instruments). First, a plurality of resin sheets was laminated on a hot plate at 80° C. to produce a resin sheet with a thickness of 0.8 mm, and the resin sheet was cut into a circular specimen with a diameter of 15 mm. Measurements were made while increasing the temperature from 40° C. to 150° C. under the conditions of a temperature rise rate of 2° C./min, a shear strain amplitude relative to the sheet thickness of 10%, and a measuring frequency of 0.5 Hz. Complex viscosities were measured, and the value of the lowest complex viscosity in the measuring range was read as a minimum melt viscosity.

Method of Measuring Loss Tangent Differential of Resin Sheet

The loss tangent differential of a resin sheet was measured using a rheometer "AG-G2" (trade name, manufactured by TA Instruments). First, a plurality of resin sheets was laminated on a hot plate at 80° C. to produce a resin sheet with a thickness of 0.8 mm, and the resin sheet was cut into a circular specimen with a diameter of 15 mm. Measurements were made while varying the shear strain amplitude relative to the sheet thickness from 0.01% to 100% under the conditions of a temperature of 80° C. and a measuring frequency of 0.5 Hz. The difference between a loss tangent as measured when the strain amplitude was 10% and a loss tangent as measured when the strain amplitude was 0.1% was calculated.

Method of Measuring Temperature at which Loss Tangent of Hardened Resin Sheet is Maximum The temperature at which the loss tangent of a hardened resin sheet is maximum was measured using a dynamic viscoelasticity measuring apparatus (DMA) "DVA-200" (trade name, manufactured by Amety Keisoku Seigyo K.K.). First, a plurality of resin sheets before hardening was laminated on a hot plate at 80° C. to produce a resin sheet with a thickness of 0.5 mm. The resin sheet hardened by heating at 180° C. for 2 hours. The resin sheet after hardening was then cut into a strip-shaped specimen of 5 mm×40 mm. Measurements were made while varying the temperature from 40° C. to 300° C. under the conditions of a measuring frequency of 1 Hz, a strain amplitude of 0.05%, and a temperature rise rate of 5° C./min. After the measurements, the temperature at which the loss tangent was maximum was read.

Method of Measuring Dispersion Particle Diameter of Inorganic Particles in Hardened Resin Sheet A hardened resin sheet was cut into a thin film with a thickness of 100 nm by ultramicotomy, and inorganic particles in the hardened resin sheet were observed using a transmission electron microscope H-7100FA (manufactured by Hitachi Ltd.). The magnification was 50,000×. In Examples 41 to 42 and Comparative Example 2, the magnification was 5,000×. The acceleration voltage was 100 kV. The observed image obtained was converted into a digital image and captured on a computer, and for each of 100 randomly-selected particles, the spherically approximated particle diameter was determined using image processing software FlvFs (available from Flovel Co., Ltd.). The particle diameters of the 100 particles thus obtained were averaged, and the average particle diameter was used as the dispersion particle diameter. In the case where primary particles are present in the form of an aggregate, the particle diameter of the aggregate was measured.

Other materials used in Examples and Comparative Examples are as described below.

(a) Epoxy Compound

EPICLON (registered trademark) HP-4700 (trade name, basic skeleton: naphthalene, available from DIC Corporation)

EPICLON (registered trademark) HP-7200H (trade name, basic skeleton: dicyclopentadiene, available from DIC Corporation)

EPICLON (registered trademark) HP-4032 (trade name, basic skeleton: naphthalene, available from DIC Corporation)

jER (registered trademark) YL980 (trade name, 185 g/eq, basic skeleton: bisphenol A, available from Mitsubishi Chemical Corporation)

jER (registered trademark) 152 (trade name, basic skeleton: phenol novolac, available from Mitsubishi Chemical Corporation)

jER (registered trademark) 8800 (trade name, basic skeleton: anthracene, available from Mitsubishi Chemical Corporation)

Epolite 4000 (trade name, basic skeleton: hydrogenated bisphenol A, available from Kyoeisha Chemical Co., Ltd.)

(b) Microcapsule Type Hardening Acceleration Agent

NOVACURE (registered trademark) HX-3941HP (trade name, available from Asahi Kasei E-materials Corporation); NOVACURE (registered trademark) HX-3941HP contains a microcapsule type hardening acceleration agent and an epoxy compound at a ratio of 1/2, and the epoxy compound contained is composed of a bisphenol A epoxy compound and a bisphenol F epoxy compound at a ratio of 1/4.

(c) Inorganic Particles

YA050C-SM1 (trade name, available from Admatechs, spherical silica particles, surface-treated with 3-methylcryloxypropyltrimethoxysilane, average primary particle diameter: 50 nm)

YA050C-SV2 (trade name, available from Admatechs, spherical silica particles, surface-treated with vinyltrimethoxysilane, average primary particle diameter: 50 nm)

YA050C-SP3 (trade name, available from Admatechs, spherical silica particles, surface-treated with phenyltrimethoxysilane, average primary particle diameter: 50 nm)

Inorganic Particles A

A silica particle dispersion "MEK-AC-5140Z" (trade name, available from Nissan Chemical Industries, Ltd., spherical silica particles, average primary particle diameter: 80 nm, surface-treated with 3-methylcryloxypropyltrimethoxysilane, methyl ethyl ketone dispersion at a silica concentration of 40% by weight) in an amount of 300 mL was introduced into a 500-mL eggplant type flask, and the solvent was removed using a rotary evaporator. The resultant was dried at 80° C. for 3 hours to give powder inorganic particles A.

Inorganic Particles B

A silica particle dispersion "SE2050-KNK" (trade name, available from Admatechs, spherical silica particles, average primary particle diameter: 500 nm, surface-treated with N-phenyl-3-aminopropyltrimethoxysilane, methyl isobutyl ketone dispersion at a silica concentration of 70% by weight) in an amount of 300 mL was introduced into a 500-mL eggplant type flask, and the solvent was removed using a rotary evaporator. The resultant was dried at 80° C. for 3 hours to give powder inorganic particles B.

Although the surface treatments of the above inorganic particles were stated in each product specification, chemical composition analysis was carried out using a Fourier transform infrared spectrometer "IR Prestige-21" (trade name, manufactured by Shimadzu Corporation) to confirm that the specification was correct.

(d) Diketone Compound Represented by Formula (1)
Diacetyl (r=0, s=0, t=0 in Formula (1))
Acetylacetone (r=0, s=1, t=0 in Formula (1))
2,5-Hexanedione (r=0, s=2, t=0 in Formula (1))
3,4-Hexanedione (r=1, s=0, t=1 in Formula (1))

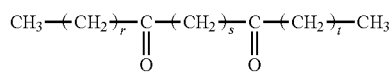
(1)

(d') Other Diketone Compound
1,3-Cyclohexanedione
(e) Acidic Acrylate
HOA-MPL (trade name, available from Kyoeisha Chemical Co., Ltd.)
TATH05 (Formula (2) below) (trade name, available from Kyoeisha Chemical Co., Ltd.)

(f) Organic Solvent-Soluble Polyimide
Organic Solvent-Soluble Polyimide A

Under a stream of dry nitrogen, 4.82 g (0.0165 mol) of 1,3-bis(3-aminophenoxy) benzene (hereinafter referred to as APB-N), 3.08 g (0.011 mol) of 3,3'-diamino-4,4'-dihydroxydiphenyl sulfone (hereinafter referred to as ABPS), 4.97 g (0.02 mol) of 1,3-bis(3-aminopropyl) tetramethyldisiloxane (hereinafter referred to as SiDA), and 0.47 g (0.05 mol) of aniline as an end-capping agent were dissolved in 130 g of N-methyl-2-pyrrolidone (hereinafter referred to as NMP). To the resulting solution, 26.02 g (0.05 mol) of 2,2-bis{4-(3,4-dicarboxyphenoxy)phenyl}propane dianhydride (hereinafter referred to as BSAA) was added together with 20 g of NMP and reacted at 25° C. for 1 hour, and then the solution was stirred at 50° C. for 4 hours. Thereafter, the solution was further stirred at 180° C. for 5 hours. After completion of the stirring, the solution was introduced into 3 L of water and filtered to collect a precipitate. The precipitate collected was washed with water three times, and then dried at 80° C. for 20 hours using a vacuum dryer. The resulting polymer solid was subjected to infrared spectroscopic analysis, and absorption peaks of an imide structure attributed to polyimide were detected around 1780 cm$^{-1}$ and around 1377 cm$^{-1}$. In this manner, an organic solvent-soluble polyimide A having a functional group reactive with epoxy and including the structure represented by Formula (3) in an amount of 11.6% by weight was obtained. When 6 g of tetrahydrofan was added to 4 g of the organic solvent-soluble polyimide A and stirred at 23° C., the tetrahydrofuran dissolved.

(g) Thixotropy Enhancing Agent
BYK (registered trademark) 410 (trade name, available from BYK-Chemie Japan)
DISPARLON (registered trademark) 6900-10X (trade name, available from Kusumoto Chemicals, Ltd.)
(h) Solvent
Propylene glycol monomethyl ether acetate (referred to as PGMEA for short)
Cyclohexamone
Methyl isobutyl ketone (referred to as MIBK for short)
Propylene glycol monomethyl ether (referred to as PGME for short)

Example 1

(1) Preparing Resin Composition

The components (a) to (h) were blended at the composition ratio shown in Table 1, and treated for 10 hours using a ball mill so that the materials uniformly mixed to thereby

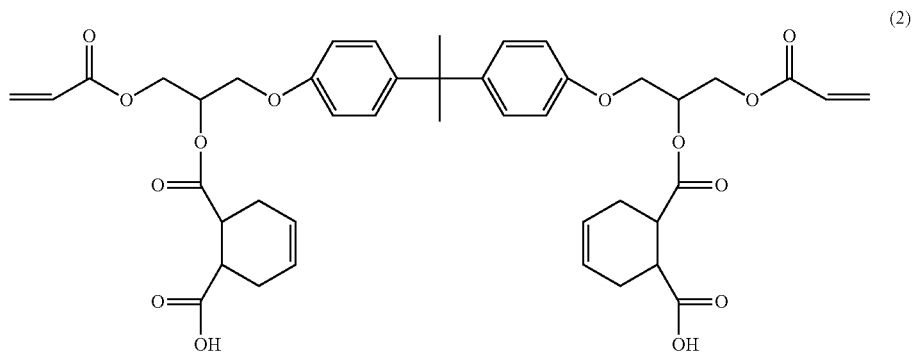 [SMILES: C=CC(=O)OCC(COc1ccc(C(C)(C)c2ccc(OCC(COC(=O)C=C)OC(=O)C3CC=CCC3C(=O)O)cc2)cc1)OC(=O)C1CC=CCC1C(=O)O]
(2)

prepare a resin composition. In the ball mill, "YTZ (registered trademark) ball" (trade name, available from Nikkato Corporation), zirconia balls with a diameter of 5 mm, was used. After the ball mill treatment, the zirconia balls were sifted out to obtain the resin composition.

(2) Producing and Evaluating Resin Sheet

The resin composition was prepared as described above and stored undisturbed at room temperature for 30 minutes. Thereafter, the resin composition was applied using a bar coater to a 75-μm-thick release film "SR-1" (trade name, available from Ohtsuki Industrial Co., Ltd.), an exfoliative substrate, and dried at 80° C. for 10 minutes to produce a resin sheet. The coating thickness was adjusted such that the thickness of the dried resin sheet would be 50 μm. The condition of the surface of the resin sheet was observed under a light microscope, and the number of aggregates 50 μm or larger in size in a square area of 10 cm×10 cm was counted and used as an indicator of the flatness of the resin sheet. The evaluation criteria are as given below, and the results are shown in Table 1.

A: No aggregates 50 μm or larger in size were observed.
B: 1 to 9 aggregates 50 μm or larger in size were observed.
C: 10 or more aggregates 50 μm or larger in size were observed.

Furthermore, after the resin composition was prepared as described above, it was stored undisturbed at room temperature for 10 hours. Thereafter, a resin sheet was produced in the same manner as described above and evaluated for flatness. The results are shown in Table 1.

Next, to the resin sheet produced from the resin composition stored undisturbed at room temperature for 10 hours, a 38-μm-thick release film "SR-3" (trade name, available from Ohtsuki Industrial Co., Ltd.) was laminated as another exfoliative substrate on the surface opposite to the above release film "SR-1" to obtain a resin sheet having exfoliative substrates on both surfaces.

The minimum melt viscosity and the loss tangent differential of the resin sheet obtained, the temperature at which the loss tangent of a hardened resin sheet is maximum, and the dispersion particle diameter of Inorganic particles in the hardened resin sheet were determined. The results are shown in Table 1.

(3) Laminating Resin Sheet to Wafer Provided with Bumps

Lamination of the resin sheet having exfoliative substrates on both surfaces to a wafer provided with bumps was carried out using a laminating device "VTM-200M" (trade name, manufactured by Takatori Corporation).

First, from the resin sheet having exfoliative substrates on both surfaces obtained in (2), the exfoliative substrate SR-3 was peeled off to expose the resin sheet. Next, to a semiconductor wafer (diameter: 200 mm, thickness: 625 μm) provided with bump electrodes with an average height of 35 μm (448 bumps/chip, pitch: 60 μm, peripheral arrangement, gold stud bump) and fixed on a stage of the laminating device, the resin sheet having an exfoliative substrate on one surface was laminated at a temperature of 80° C. and a lamination speed of 20 mm/s such that the bump electrode-formed surface of the semiconductor wafer and the surface without an exfoliative surface of the resin sheet faced each other. The excess resin sheet on the periphery of the semiconductor wafer was cut with a cutter blade to obtain a semiconductor wafer on which the resin sheet was laminated with the bump electrodes being embedded in the resin sheet.

(4) Dicing

The semiconductor wafer obtained in (3) on which the resin sheet was laminated was fixed to a tape frame. The fixing was carried out by laminating dicing tape "UHP-110B" (trade name, available from Toyo ADTEC) to the wafer board surface opposite to the bump electrodes using a wafer mounter "FM-114" (trade name, manufactured by Technovision, Inc.). Next, the exfoliative substrate SR-1 was peeled off the resin sheet to expose the resin sheet. On a cutting stage of a dicing device "DAD-3350" (trade name, manufactured by DISCO Corporation), the tape frame was fixed with the resin sheet facing upward, and alignment was performed using a CCD camera of the dicing device. The alignment was carried out using an automatic alignment function of the dicing device by reading alignment marks on the surface of the semiconductor wafer, following the alignment, dicing was performed to obtain a semiconductor chip (7.3 mm square) provided with the resin sheet.

(5) Flip Chip Packaging

The semiconductor chip provided with the resin sheet manufactured in (4) was flip chip packages on a circuit board (copper electrode). The packaging equipment used was a flip chip bonding device "FC-2000" (trade name, manufactured by Toray Engineering Co., Ltd.). In the flip chip bonding, temporary press-bonding was performed under the conditions of a temperature of 100° C. and a pressure of 15 N/chip for 5 seconds, and then final press-bonding was performed for 10 seconds under the conditions of a temperature of 200° C. and a pressure of 100 N/chip. This provided a semiconductor device in which the semiconductor chip and the circuit board were electrically connected.

Evaluation of air bubbles existing in the resin sheet after the packaging process was carried out by removing the semiconductor chip by polishing and then counting the number of air bubbles existing in the adherence surface (resin sheet) between the semiconductor chip and the circuit board in the semiconductor device using a microscope. The evaluation criteria are as given below, and the results are shown in Table 1.

A: 0 to 5 air bubbles 15 μm or larger in size were observed.
B: 6 to 20 air bubbles 15 μm or larger in size were observed.
C: More than 20 air bubbles 15 μm or larger in size were observed.

(6) Reliability Test

The semiconductor device manufactured in (5) was left to stand in a thermo-hygrostat at 85° C. and 60% RH for 168 hours to absorb moisture. Thereafter, heat treatment was performed under the reflow conditions of 260° C. for 5 seconds. Subsequently, a cycle of holding the semiconductor device at −55° C. for 15 minutes and then holding it at 125° C. for 15 minutes was repeated 1000 times.

An electrical continuity test (connection reliability test) between the semiconductor chip and the board in the semiconductor device after the above treatment was performed. Those which achieved continuity were evaluated as passed, and those which did not achieve continuity as failed. The evaluation was carried out using 10 samples, and the number of passed samples was recorded (connection reliability test A). The results are shown in Table 1.

The semiconductor device manufactured in (5) was left to stand in a constant-temperature high-humidity bath at 85° C. and 60% RH for 168 hours to absorb moisture, and then heat-treated under the reflow conditions of 260° C. for 5 seconds, after which a cycle of holding the semiconductor device at −40° C. for 15 minutes and then holding it at 125° C. for 15 minutes was repeated 1000 times.

An electrical continuity test (connection reliability test) between the semiconductor chip and the board in the semiconductor device alter the above treatment was performed.

Those which achieved continuity were evaluated as passed, and those which did not achieve continuity as failed. The evaluation was carried, out using 10 samples, and the number of passed samples was recorded (connection reliability test B). The results are shown in Table 1.

Examples 2 to 46, Comparative Examples 1 to 2

The resin sheet was produced and evaluated in the same manner as in Example 1 except that the components were blended at each composition ratio shown in Tables 1 to 9. The results are shown in Tables 1 to 9.

TABLE 1

| | | | | Example 1 | Example 2 | Example 3 | Example 4 | Example 5 | Example 6 |
|---|---|---|---|---|---|---|---|---|---|
| Composition | (a) | Epoxy 1 | Material | EPICLON HP-4700 | EPICLON HP-4700 | EPICLON HP-4700 | EPICLON HP-4700 | EPICLON HP-4700 | EPICLON HP-4700 |
| | | | Material profile | Napthalene | Napthalene | Napthalene | Napthalene | Napthalene | Napthalene |
| | | | Basic skeleton | | | | | | |
| | | | Amount (parts by weight) | 45 | 45 | 45 | 45 | 45 | 45 |
| | | Epoxy 2 | Material | jERYL980 | jERYL980 | jERYL980 | jERYL980 | jERYL980 | jERYL980 |
| | | | Material profile | Bisphenol A | Bisphenol A | Bisphenol A | Bisphenol A | Bisphenol A | Bisphenol A |
| | | | Basic skeleton | | | | | | |
| | | | Amount (parts by weight) | 10 | 10 | 10 | 10 | 10 | 10 |
| | (b) | Microcapsule type hardening acceleration agent | Material | NOVACURE HX-3941HP | NOVACURE HX-3941HP | NOVACURE HX-3941HP | NOVACURE HX-3941HP | NOVACURE HX-3941HP | NOVACURE HX-3941HP |
| | | | Material profile | 33 wt % | 33 wt % | 33 wt % | 33 wt % | 33 wt % | 33 wt % |
| | | | Amount of hardening acceleration agent | | | | | | |
| | | | Amount (parts by weight) | 30 | 30 | 30 | 30 | 30 | 30 |
| | (c) | Inorganic particles | Material | YA050C-SM1 | YA050C-SM1 | YA050C-SM1 | YA050C-SM1 | YA050C-SM1 | YA050C-SM1 |
| | | | Particle name | Silica | Silica | Silica | Silica | Silica | Silica |
| | | | Surface composition | Methacryloxy group | Methacryloxy group | Methacryloxy group | Methacryloxy group | Methacryloxy group | Methacryloxy group |
| | | | Primary particle diameter | 50 nm | 50 nm | 50 nm | 50 nm | 50 nm | 50 nm |
| | | | Amount (parts by weight) | 100 | 100 | 100 | 100 | 100 | 100 |
| | (d) or (d') | Diketone compound | Material name | Acetylacetone | Diacetyl | 2,5-Hexanedione | 3,4-Hexanedione | Acetylacetone | Diacetyl |
| | | | Amount (parts by weight) | 5 | 5 | 5 | 5 | 5 | 5 |
| | (e) | Acidic acrylate | Material name | HOA-MPL | HOA-MPL | HOA-MPL | HOA-MPL | TATH05 | TATH05 |
| | | | Amount (parts by weight) | 2 | 2 | 2 | 2 | 5 | 5 |
| | (f) | Organic solvent-soluble polyimide | Material name | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | | Amount (parts by weight) | 15 | 15 | 15 | 15 | 15 | 15 |
| | (g) | Thixotropy enhancing agent | Material name | — | — | — | — | — | — |
| | (h) | Solvent | Material name | PGMEA | PGMEA | PGMEA | PGMEA | PGMEA | PGMEA |
| | | | Amount (parts by weight) | 150 | 150 | 150 | 150 | 150 | 150 |
| Evaluation results | Resin sheet | Before hardening | Evaluation for flatness Stored for 30 min | A | A | A | A | A | A |
| | | | Stored for 10 hr | A | A | A | A | A | A |
| | | | Minimum melt viscosity (Pa·s) | 860 | 880 | 890 | 890 | 780 | 790 |
| | | | Loss tangent (80° C.) Strain 0.1% | 1.7 | 1.8 | 1.8 | 1.9 | 1.8 | 1.6 |
| | | | Strain 10% | 4.2 | 4.2 | 4.3 | 4.3 | 4.3 | 4.2 |
| | | | Difference | 2.5 | 2.4 | 2.5 | 2.4 | 2.7 | 2.6 |
| | | After hardening | Temperature at maximum loss tangent (° C.) | 185 | 182 | 182 | 183 | 186 | 185 |
| | | | Dispersion particle diameter of inorganic particles (nm) | 69 | 70 | 70 | 72 | 68 | 68 |
| | Packaging test | | Number of air bubbles | A | A | A | A | A | A |
| | | | Number of passes (of 10 samples) in connection reliability test A | 10 | 10 | 10 | 10 | 10 | 10 |
| | | | Number of passes (of 10 samples) in connection reliability test B | 10 | 10 | 10 | 10 | 10 | 10 |

TABLE 2

| | | | Example 7 | Example 8 | Example 9 | Example 10 | Example 11 | Example 12 |
|---|---|---|---|---|---|---|---|---|
| Composition | (a) | Epoxy 1 | | | | | | |
| | | Material profile | EPICLON HP-4700 | EPICLON HP-4700 | EPICLON HP-7200H | EPICLON HP-4700 | EPICLON HP-4700 | EPICLON HP-7200H |
| | | Basic skeleton | Naphthalene | Naphthalene | Dicyclopentadiene | Naphthalene | Naphthalene | Dicyclopentadiene |
| | | Amount (parts by weight) | 45 | 45 | 45 | 45 | 45 | 35 |
| | | Epoxy 2 | | | | | | |
| | | Material profile | jERYL980 | jERYL980 | jERYL980 | jER152 | Epolite 4000 | EPICLON HP-4032 |
| | | Basic skeleton | Bisphenol A | Bisphenol A | Bisphenol A | Phenol novolac | Hydrogenated Bisphenol A | Naphthalene |
| | | Amount (parts by weight) | 10 | 10 | 10 | 10 | 10 | 20 |
| | (b) | Microcapsule type hardening acceleration agent | | | | | | |
| | | Material profile | NOVACURE HX-3941HP | NOVACURE HX-3941HP | NOVACURE HX-3941HP | NOVACURE HX-3941HP | NOVACURE HX-3941HP | NOVACURE HX-3941HP |
| | | Amount of hardening acceleration agent | 33 wt % | 33 wt % | 33 wt % | 33 wt % | 33 wt % | 33 wt % |
| | | Amount (parts by weight) | 30 | 30 | 30 | 30 | 30 | 30 |
| | (c) | Inorganic particles | | | | | | |
| | | Material name | YA050C-SM1 | YA050C-SM1 | YA050C-SM1 | YA050C-SM1 | YA050C-SM1 | YA050C-SM1 |
| | | Particle name | Silica | Silica | Silica | Silica | Silica | Silica |
| | | Surface composition | Methacryloxy group | Methacryloxy group | Methacryloxy group | Methacryloxy group | Methacryloxy group | Methacryloxy group |
| | | Primary particle diameter | 50 nm | 50 nm | 50 nm | 50 nm | 50 nm | 50 nm |
| | | Amount (parts by weight) | 100 | 100 | 100 | 100 | 100 | 100 |
| | (d) or (d') | Diketone compound | | | | | | |
| | | Material name | 2,5-Hexanedione | Acetylacetone | Acetylacetone | Acetylacetone | Acetylacetone | Acetylacetone |
| | | Amount (parts by weight) | 5 | 5 | 5 | 5 | 5 | 5 |
| | (e) | Acidic acrylate | | | | | | |
| | | Material name | TAITH05 | — | HOA-MPL | HOA-MPL | HOA-MPL | HOA-MPL |
| | | Amount (parts by weight) | 5 | — | 2 | 2 | 2 | 2 |
| | (f) | Organic solvent-soluble polyimide | | | | | | |
| | | Material name | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | Amount (parts by weight) | 15 | 15 | 15 | 15 | 15 | 15 |
| | (g) | Thixotropy enhancing agent | | | | | | |
| | | Material name | — | — | — | — | — | — |
| | | Amount (parts by weight) | — | — | — | — | — | — |
| | (h) | Solvent | | | | | | |
| | | Material name | PGMEA | PGMEA | PGMEA | PGMEA | PGMEA | PGMEA |
| | | Amount (parts by weight) | 150 | 150 | 150 | 150 | 150 | 150 |
| Evaluation results | Resin sheet | Before hardening | | | | | | |
| | | Evaluation for flatness | A | A | A | A | A | A |
| | | Minimum melt viscosity (80° C.) | A | A | A | A | A | A |
| | | Minimum melt viscosity (Pa·s) | 800 | 750 | 880 | 870 | 810 | 800 |
| | | Loss tangent (80° C.) Strain 0.1% | 1.8 | 2 | 3.2 | 1.7 | 2.2 | 2.1 |
| | | Loss tangent (80° C.) Strain 10% | 4.3 | 4.5 | 4.5 | 4.1 | 4.1 | 4.3 |
| | | Loss tangent (80° C.) Difference | 2.5 | 2.5 | 1.3 | 2.4 | 1.9 | 2.2 |
| | | Stored for 30 min | | | | | | |
| | | Stored for 10 hr | | | | | | |
| | After hardening | Temperature at maximum loss tangent (° C.) | 184 | 179 | 158 | 185 | 150 | 171 |
| | | Dispersion particle diameter of inorganic particles (nm) | 69 | 69 | 70 | 70 | 72 | 70 |
| Packaging test | | Number of air bubbles | A | A | B | A | B | A |
| | | Number of passes (of 10 samples) in connection reliability test A | 10 | 9 | 8 | 10 | 7 | 10 |
| | | Number of passes (of 10 samples) in connection reliability test B | 10 | 10 | 10 | 10 | 10 | 10 |

TABLE 3

| | | | | Example 13 | Example 14 | Example 15 | Example 16 | Example 17 | Example 18 |
|---|---|---|---|---|---|---|---|---|---|
| Composition | (a) | Epoxy 1 | Material profile | EPICLON HP-7200H | EPICLON HP-4700 | EPICLON HP-4700 | EPICLON HP-4700 | EPICLON HP-4700 | EPICLON HP-4700 |
| | | | Basic skeleton | Dicyclopentadiene | Naphthalene | Naphthalene | Naphthalene | Naphthalene | Naphthalene |
| | | | Amount (parts by weight) | 45 | 55 | 40 | 45 | 45 | 45 |
| | | Epoxy 2 | Material profile | jERYX8800 | — | jERYL980 | jERYL980 | jERYL980 | jERYL980 |
| | | | Basic skeleton | Anthracene | — | Bisphenol A | Bisphenol A | Bisphenol A | Bisphenol A |
| | | | Amount (parts by weight) | 20 | — | 10 | 10 | 10 | 10 |
| | (b) | Microcapsule type hardening acceleration agent | Material profile | NOVACURE HX-3941HP | NOVACURE HX-3941HP | NOVACURE HX-3941HP | NOVACURE HX-3941HP | NOVACURE HX-3941HP | NOVACURE HX-3941HP |
| | | | Amount of hardening acceleration agent | 33 wt % | 33 wt % | 33 wt % | 33 wt % | 33 wt % | 33 wt % |
| | | | Amount (parts by weight) | 30 | 30 | 30 | 30 | 30 | 30 |
| | (c) | Inorganic particles | Material name | YA050C-SM1 | YA050C-SM1 | YA050C-SM1 | YA050C-SM1 | YA050C-SV2 | YA050C-SV2 |
| | | | Particle name | Silica | Silica | Silica | Silica | Silica | Silica |
| | | | Surface composition | Methacryloxy group | Methacryloxy group | Methacryloxy group | Methacryloxy group | Vinyl group | Vinyl group |
| | | | Primary particle diameter | 50 nm | 50 nm | 50 nm | 50 nm | 50 nm | 50 nm |
| | | | Amount (parts by weight) | 100 | 100 | 100 | 100 | 100 | 100 |
| | (d) or (d') | Diketone compound | Material name | Acetylacetone | Acetylacetone | Acetylacetone | — | Acetylacetone | Acetylacetone |
| | | | Amount (parts by weight) | 5 | 5 | 5 | — | 5 | 5 |
| | (e) | Acidic acrylate | Material name | HOA-MPL | HOA-MPL | HOA-MPL | HOA-MPL | HOA-MPL | TATH05 |
| | | | Amount (parts by weight) | 2 | 2 | 2 | 2 | 2 | 2 |
| | (f) | Organic solvent-soluble polyimide | Material name | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | | Amount (parts by weight) | 15 | 15 | 20 | 15 | 15 | 15 |
| | (g) | Thixotropy enhancing agent | Material name | — | — | — | — | — | — |
| | | | Amount (parts by weight) | — | — | — | — | — | — |
| | (h) | Solvent | Material name | PGMEA | PGMEA | PGMEA | PGMEA | PGMEA | PGMEA |
| | | | Amount (parts by weight) | 150 | 150 | 150 | 160 | 150 | 150 |
| Evaluation results | Resin sheet | Before hardening | Evaluation for flatness Stored for 30 min | A | A | A | B | A | A |
| | | | Stored for 10 hr | A | A | A | C | A | A |
| | | | Minimum melt viscosity (Pa·s) | 890 | 780 | 780 | 850 | 890 | 830 |
| | | | Loss tangent (80° C.) Strain 0.1% | 2 | 1.5 | 1.5 | 1.8 | 1.7 | 1.7 |
| | | | Strain 10% | 4.4 | 3.6 | 3.5 | 4.1 | 4.1 | 4.3 |
| | | | Difference | 1.4 | 2.1 | 2 | 2.3 | 2.4 | 2.6 |
| | | After hardening | Temperature at maximum loss tangent (° C.) | 172 | 186 | 184 | 184 | 185 | 185 |
| | | | Dispersion particle diameter of inorganic particles (nm) | 69 | 68 | 71 | 73 | 71 | 70 |
| | Packaging test | Number of air bubbles | | A | A | A | B | A | A |
| | | Number of passes (of 10 samples) in connection reliability test A | | 10 | 10 | 10 | 0 | 10 | 10 |
| | | Number of passes (of 10 samples) in connection reliability test B | | 10 | 10 | 10 | 7 | 10 | 10 |

TABLE 4

| | | | | Example 19 | Example 20 | Example 21 | Example 22 | Example 23 | Example 24 |
|---|---|---|---|---|---|---|---|---|---|
| Composition | (a) | Epoxy 1 | Material profile | Material name | EPICLON HP-4700 | EPICLON HP-4700 | EPICLON HP-4700 | EPICLON HP-4700 | EPICLON HP-4700 | EPICLON HP-4700 |
| | | | | Basic skeleton | Naphthalene | Naphthalene | Naphthalene | Naphthalene | Naphthalene | Naphthalene |
| | | | Amount (parts by weight) | | 45 | 45 | 45 | 45 | 45 | 45 |
| | | Epoxy 2 | Material profile | Material name | jERYL980 | jERYL980 | jERYL980 | jERYL980 | jERYL980 | jERYL980 |
| | | | | Basic skeleton | Bisphenol A | Bisphenol A | Bisphenol A | Bisphenol A | Bisphenol A | Bisphenol A |
| | | | Amount (parts by weight) | | 10 | 10 | 10 | 10 | 10 | 10 |
| | (b) | Microcapsule type hardening acceleration agent | Material profile | Material name | NOVACURE HX-3941HP | NOVACURE HX-3941HP | NOVACURE HX-3941HP | NOVACURE HX-3941HP | NOVACURE HX-3941HP | NOVACURE HX-3941HP |
| | | | | Amount of hardening acceleration agent | 33 wt % | 33 wt % | 33 wt % | 33 wt % | 33 wt % | 33 wt % |
| | | | Amount (parts by weight) | | 30 | 30 | 30 | 30 | 30 | 30 |
| | (c) | Inorganic particles | Material profile | Particle name | YA050C-SV2 | YA050C-SV2 | YA050C-SV2 | YA050C-SP3 | YA050C-SP3 | YA050C-SP3 |
| | | | | Surface composition | Silane | Silane | Silane | Silane | Silane | Silane |
| | | | | | Vinyl group | Vinyl group | Vinyl group | Phenol group | Phenol group | Phenol group |
| | | | | Primary particle diameter | 50 nm | 50 nm | 50 nm | 50 nm | 50 nm | 50 nm |
| | | | Amount (parts by weight) | | 100 | 100 | 100 | 100 | 100 | 100 |
| | (d) or (d') | Diketone compound | Material name | | Diacetyl | 2,5-Hexanedione | 3,4-Hexanedione | Acetylacetone | Acetylacetone | Acetylacetone |
| | | | Amount (parts by weight) | | 5 | 5 | 5 | 5 | 5 | 5 |
| | (e) | Acidic acrylate | Material name | | TATH05 | TATH05 | TATH05 | HOA-MPL | TATH05 | — |
| | | | Amount (parts by weight) | | 5 | 5 | 5 | 2 | 5 | — |
| | (f) | Organic solvent-soluble polyimide | Material name | | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | | Amount (parts by weight) | | 15 | 15 | 15 | 15 | 15 | 15 |
| | (g) | Thixotropy enhancing agent | Material name | | — | — | — | — | — | — |
| | | | Amount (parts by weight) | | — | — | — | — | — | — |
| | (h) | Solvent | Material name | | PGMEA | PGMEA | PGMEA | PGMEA | PGMEA | PGMEA |
| | | | Amount (parts by weight) | | 150 | 150 | 150 | 150 | 150 | 150 |
| Evaluation results | Resin sheet | Before hardening | Evaluation for flatness | Stored for 30 min | A | A | A | A | A | A |
| | | | | Stored for 10 hr | A | A | A | A | A | A |
| | | | Minimum melt viscosity (Pa · s) | | 840 | 820 | 810 | 1100 | 850 | 770 |
| | | | Loss tangent (80° C.) | Strain 0.1% | 1.8 | 1.8 | 1.8 | 1.8 | | 2 |
| | | | | Strain 10% | 4.1 | 4.2 | 4.2 | 4.2 | 4.1 | 4.2 |
| | | | | Difference | 2.3 | 2.4 | 2.4 | 2.4 | 2.1 | 2.2 |
| | | After hardening | Temperature at maximum loss tangent (° C.) | | 184 | 186 | 186 | 183 | 179 | 175 |
| | | | Dispersion particle diameter of inorganic particles (nm) | | 72 | 72 | 73 | 75 | 74 | 76 |
| | Packaging test | Number of air bubbles | | | A | A | A | A | A | A |
| | | Number of passes (of 10 samples) in connection reliability test A | | | 10 | 10 | 10 | 10 | 10 | 9 |
| | | Number of passes (of 10 samples) in connection reliability test B | | | 10 | 10 | 10 | 10 | 10 | 10 |

TABLE 5

| | | | | Example 25 | Example 26 | Example 27 | Example 28 | Example 29 | Example 30 |
|---|---|---|---|---|---|---|---|---|---|
| Composition | (a) | Epoxy 1 | Material profile | Material name | EPICLON HP-7200H | EPICLON HP-7200H | EPICLON HP-7200H | EPICLON HP-4700 | EPICLON HP-4700 | EPICLON HP-4700 |
| | | | | Basic skeleton | Dicyclopentadiene | Dicyclopentadiene | Dicyclopentadiene | Naphthalene | Naphthalene | Naphthalene |
| | | | Amount (parts by weight) | | 45 | 35 | 45 | 45 | 45 | 45 |
| | | Epoxy 2 | Material profile | Material name | jERYL980 | EPICLON HP-4032 | jERYX8800 | jERYL980 | jERYL980 | jERYL980 |
| | | | | Basic skeleton | Bisphenol A | Naphthalene | Anthracene | Bisphenol A | Bisphenol A | Bisphenol A |
| | | | Amount (parts by weight) | | 10 | 20 | 20 | 10 | 10 | 10 |
| | (b) | Microcapsule type hardening acceleration agent | Material profile | Material name | NOVACURE HX-3941HP | NOVACURE HX-3941HP | NOVACURE HX-3941HP | NOVACURE HX-3941HP | NOVACURE HX-3941HP | NOVACURE HX-3941HP |
| | | | | Amount of hardening acceleration agent | 33 wt % | 33 wt % | 33 wt % | 33 wt % | 33 wt % | 33 wt % |
| | | | Amount (parts by weight) | | 30 | 30 | 30 | 30 | 30 | 30 |
| | (c) | Inorganic particles | Material profile | Material name | YA050C-SP3 | YA050C-SP3 | YA050C-SP3 | Inorganic particles A | Inorganic particles A | Inorganic particles A |
| | | | | Particle name | Silica | Silica | Silica | Silica | Silica | Silica |
| | | | | Surface composition | Phenyl group | Phenyl group | Phenyl group | Methacryloxy group | Methacryloxy group | Methacryloxy group |
| | | | | Primary particle diameter | 50 nm | 50 nm | 50 nm | 80 nm | 80 nm | 50 nm |
| | | | Amount (parts by weight) | | 100 | 100 | 100 | 100 | 100 | 100 |
| | (d) or (d') | Diketone compound | Material name | | Acetylacetone | Acetylacetone | Acetylacetone | Acetylacetone | Diacetyl | 2,5-Hexanedione |
| | | | Amount (parts by weight) | | 5 | 5 | 5 | 5 | 5 | 5 |
| | (e) | Acidic acrylate | Material name | | TATH05 | TATH05 | TATH05 | TATH05 | TATH05 | TATH05 |
| | | | Amount (parts by weight) | | 5 | 5 | 5 | 5 | 5 | 5 |
| | (f) | Organic solvent-soluble polyimide | Material name | | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | | Amount (parts by weight) | | 15 | 15 | 15 | 15 | 15 | 15 |
| | (g) | Thixotropy enhancing agent | Material name | | — | — | — | — | — | — |
| | | | Amount (parts by weight) | | — | — | — | — | — | — |
| | (h) | Solvent | Material name | | PGMEA | PGMEA | PGMEA | PGMEA | PGMEA | PGMEA |
| | | | Amount (parts by weight) | | 150 | 150 | 150 | 90 | 90 | 90 |
| Evaluation results | Resin sheet | Before hardening | Evaluation for flatness | Stored for 30 min | A | A | A | A | A | A |
| | | | | Stored for 10 hr | A | A | A | A | A | A |
| | | | Minimum melt viscosity (Pa·s) | | 880 | 900 | 800 | 140 | 170 | 170 |
| | | | Loss tangent (80° C.) | Strain 0.1% | 2.9 | 1.9 | 1.8 | 2 | 2.1 | 2 |
| | | | | Strain 10% | 4 | 4.2 | 4 | 4.7 | 4.8 | 4.6 |
| | | | | Difference | 1.1 | 2.3 | 2.2 | 2.7 | 2.7 | 2.6 |
| | | After hardening | Temperature at maximum loss tangent (° C.) | | 156 | 170 | 171 | 180 | 179 | 177 |
| | | | Dispersion particle diameter of inorganic particles (nm) | | 75 | 73 | 74 | 96 | 96 | 99 |
| | Packaging test | Number of air bubbles | | | B | A | A | A | A | A |
| | | Number of passes (of 10 samples) in connection reliability test A | | | 8 | 10 | 10 | 10 | 10 | 10 |
| | | Number of passes (of 10 samples) in connection reliability test B | | | 10 | 10 | 10 | 10 | 10 | 10 |

TABLE 6

| | | | | Example 31 | Example 32 | Example 33 | Example 34 | Example 35 | Example 36 |
|---|---|---|---|---|---|---|---|---|---|
| Composition | (a) | Epoxy 1 | Material profile | Material name | EPICLON HP-4700 | EPICLON HP-7200H | EPICLON HP-7200H | EPICLON HP-7200H | EPICLON HP-4700 | EPICLON HP-4700 |
| | | | | Basic skeleton | Naphthalene | Dicyclopentadiene | Dicyclopentadiene | Dicyclopentadiene | Naphthalene | Naphthalene |
| | | | Amount (parts by weight) | | 45 | 45 | 45 | 45 | 45 | 45 |
| | | Epoxy 2 | Material profile | Material name | jERYL980 | jERYL980 | jERYL980 | jERYL980 | jERYL980 | jERYL980 |
| | | | | Basic skeleton | Bisphenol A | Bisphenol A | Bisphenol A | Bisphenol A | Bisphenol A | Bisphenol A |
| | | | Amount (parts by weight) | | 10 | 10 | 10 | 10 | 10 | 10 |
| | (b) | Microcapsule type hardening acceleration agent | Material profile | Material name | NOVACURE HX-3941HP | NOVACURE HX-3941HP | NOVACURE HX-3941HP | NOVACURE HX-3941HP | NOVACURE HX-3941HP | NOVACURE HX-3941HP |
| | | | | | 33 wt % | 33 wt % | 33 wt % | 33 wt % | 33 wt % | 33 wt % |
| | | | Amount of hardening acceleration agent | | 30 | 30 | 30 | 30 | 30 | 30 |
| | (c) | Inorganic particles | Material profile | Material name | Inorganic particles A | Inorganic particles A | Inorganic particles A | Inorganic particles A | Inorganic particles A | Inorganic particles A |
| | | | | Particle name | Silica | Silica | Silica | Silica | Silica | Silica |
| | | | | Surface composition | Methacryloxy group | Methacryloxy group | Methacryloxy group | Methacryloxy group | Methacryloxy group | Methacryloxy group |
| | | | | Primary particle diameter | 80 nm | 80 nm | 80 nm | 80 nm | 80 nm | 80 nm |
| | | | Amount (parts by weight) | | 100 | 100 | 100 | 100 | 100 | 150 |
| | (d) or (d') | Diketone compound | Material name | | 3,4-Hexanedione | Acetylacetone | Acetylacetone | Acetylacetone | Acetylacetone | Acetylacetone |
| | | | Amount (parts by weight) | | 5 | 5 | 5 | 5 | 5 | 5 |
| | (e) | Acidic acrylate | Material name | | TATH05 | TATH05 | TATH05 | TATH05 | — | — |
| | | | Amount (parts by weight) | | 5 | 5 | 5 | 5 | — | 5 |
| | (f) | Organic solvent-soluble polyimide | Material name | | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | | Amount (parts by weight) | | 15 | 15 | 15 | 15 | 15 | 15 |
| | (g) | Thixotropy enhancing agent | Material name | | — | — | BYK-410 | DISPARLON 6900-10X | — | — |
| | | | Amount (parts by weight) | | — | — | 5 | 5 | — | — |
| | (h) | Solvent | Material name | | PGMEA | PGMEA | PGMEA | PGMEA | PGMEA | PGMEA |
| | | | Amount (parts by weight) | | 90 | 90 | 100 | 100 | 90 | 110 |
| Evaluation results | Resin sheet | Before hardening | Evaluation for flatness | Stored for 30 min | A | A | A | A | A | A |
| | | | | Stored for 10 hr | A | A | A | A | A | A |
| | | | Minimum melt viscosity (Pa·s) | | 180 | 180 | 620 | 630 | 100 | 360 |
| | | | Loss tangent (80° C.) | Strain 0.1% | 1.9 | 3.4 | 1.6 | 1.9 | 2.1 | 2 |
| | | | | Strain 10% | 4.5 | 4.6 | 4.1 | 4.2 | 4.2 | 4.4 |
| | | | | Difference | 2.6 | 1.2 | 2.3 | 2.3 | 2.1 | 2.4 |
| | | After hardening | Temperature at maximum loss tangent (° C.) | | 179 | 152 | 166 | 169 | 172 | 179 |
| | | | Dispersion particle diameter of inorganic particles (nm) | | 100 | 99 | 103 | 105 | 98 | 105 |
| | Packaging test | Number of air bubbles | | | A | B | A | A | A | A |
| | | Number of passes (of 10 samples) in connection reliability test A | | | 10 | 7 | 10 | 10 | 5 | 10 |
| | | Number of passes (of 10 samples) in connection reliability test B | | | 10 | 10 | 10 | 10 | 10 | 10 |

TABLE 7

| | | | | Example 37 | Example 38 | Example 39 | Example 40 | Example 41 | Example 42 |
|---|---|---|---|---|---|---|---|---|---|
| Composition | (a) | Epoxy 1 | Material profile | Material name | EPICLON HP-4700 | EPICLON HP-4700 | EPICLON HP-4700 | EPICLON HP-7200H | EPICLON HP-7200H | EPICLON HP-4700 |
| | | | | Basic skeleton | Naphthalene | Naphthalene | Naphthalene | Dicyclopentadiene | Dicyclopentadiene | Naphthalene |
| | | | Amount (parts by weight) | | 40 | 55 | 45 | 45 | 45 | 45 |
| | | Epoxy 2 | Material profile | Material name | jERYL980 | — | jERYL980 | jERYL980 | jERYL980 | jERYL980 |
| | | | | Basic skeleton | Bisphenol A | — | Bisphenol A | Bisphenol A | Bisphenol A | Bisphenol A |
| | | | Amount (parts by weight) | | 10 | — | 10 | 10 | 10 | 10 |
| | (b) | Microcapsule type hardening acceleration agent | Material profile | Material name | NOVACURE HX-3941HP | NOVACURE HX-3941HP | NOVACURE HX-3941HP | NOVACURE HX-3941HP | NOVACURE HX-3941HP | NOVACURE HX-3941HP |
| | | | | | 33 wt % | 33 wt % | 33 wt % | 33 wt % | 33 wt % | 33 wt % |
| | | | Amount of hardening acceleration agent | | 30 | 30 | 30 | 30 | 30 | 30 |
| | (c) | Inorganic particles | Material profile | Particle name | Inorganic particles A | Inorganic particles A | Inorganic particles A | Inorganic particles B | Inorganic particles B | Inorganic particles A |
| | | | | Surface composition | Silica | Silica | Silica | Silica | Silica | Silica |
| | | | | Primary particle diameter | Methacryloxy group 80 nm | Methacryloxy group 80 nm | Methacryloxy group 80 nm | Aminophenyl group 500 nm | Aminophenyl group 500 nm | Methacryloxy group 80 nm |
| | | | Amount (parts by weight) | | 150 | 150 | 100 | 100 | 100 | 100 |
| | (d) or (d') | Diketone compound | Material name | | Acetylacetone | Acetylacetone | — | Acetylacetone | Acetylacetone | 1,3-Cyclohexanedione |
| | | | Amount (parts by weight) | | 5 | 5 | — | 5 | 5 | 5 |
| | (e) | Acidic acrylate | Material name | | TATH05 | TATH05 | TATH05 | HOA-MPL | HOA-MPL | TATH05 |
| | | | Amount (parts by weight) | | 5 | 5 | 5 | 2 | 2 | 5 |
| | (f) | Organic solvent-soluble polyimide | Material name | | Organic solvent-soluble polyimide A | Organic solvent-soluble polyimide A | Organic solvent-soluble polyimide A | Organic solvent-soluble polyimide A | Organic solvent-soluble polyimide A | Organic solvent-soluble polyimide A |
| | | | Amount (parts by weight) | | 20 | 15 | 15 | 15 | 15 | 15 |
| | (g) | Thixotropy enhancing agent | Material name | | — | — | — | BYK-410 | DISPARLON 6900-10X | — |
| | | | Amount (parts by weight) | | — | — | — | 5 | 5 | — |
| | (h) | Solvent | Material name | | PGMEA | PGMEA | PGMEA | PGMEA | PGMEA | PGMEA |
| | | | Amount (parts by weight) | | 90 | 90 | 90 | 70 | 70 | 90 |
| Evaluation results | Resin sheet | Before hardening | Evaluation for flatness | Stored for 30 min | A | A | B | A | A | A |
| | | | | Stored for 10 hr | A | A | C | A | A | B |
| | | | Minimum melt viscosity (Pa·s) | | 440 | 370 | 130 | 340 | 350 | 15000 |
| | | | Loss tangent (80° C.) | Strain 0.1% | 2 | 2 | 2.6 | 2.8 | 2.7 | 2.2 |
| | | | | Strain 10% | 4.3 | 4.5 | 4.4 | 4.8 | 4.7 | 4.3 |
| | | | | Difference | 2.3 | 2.5 | 1.8 | 2 | 2 | 2.1 |
| | | After hardening | Temperature at maximum loss tangent (° C.) | | 176 | 175 | 178 | 280 | 310 | 179 |
| | | | Dispersion particle diameter of inorganic particles (nm) | | 106 | 104 | 102 | 630 | 670 | 115 |
| | Packaging test | Number of air bubbles | | | A | A | B | A | A | B |
| | | Number of passes (of 10 samples) in connection reliability test A | | | 10 | 10 | 0 | 9 | 9 | 2 |
| | | Number of passes (of 10 samples) in connection reliability test B | | | 10 | 10 | 7 | 10 | 10 | 8 |

TABLE 8

| | | | Example 43 | Example 44 | Example 45 | Example 46 |
|---|---|---|---|---|---|---|
| Composition | (a) | Epoxy 1 | | | | |
| | | Material profile Material name | EPICLON HP-4700 | EPICLON HP-4700 | EPICLON HP-4700 | EPICLON HP-4700 |
| | | Material profile Basic skeleton | Naphthalene | Naphthalene | Naphthalene | Naphthalene |
| | | Amount (parts by weight) | 45 | 45 | 45 | 45 |
| | | Epoxy 2 | | | | |
| | | Material profile Material name | jERYL980 | jERYL980 | jERYL980 | jERYL980 |
| | | Material profile Basic skeleton | Bisphenol A | Bisphenol A | Bisphenol A | Bisphenol A |
| | | Amount (parts by weight) | 10 | 10 | 10 | 10 |
| | (b) | Microcapsule type hardening acceleration agent | | | | |
| | | Material profile Material name | NOVACURE HX-3941HP | NOVACURE HX-3941HP | NOVACURE HX-3941HP | NOVACURE HX-3941HP |
| | | Material profile Amount of hardening acceleration agent | 33 wt % | 33 wt % | 33 wt % | 33 wt % |
| | | Amount (parts by weight) | 30 | 30 | 30 | 30 |
| | (c) | Inorganic particles | | | | |
| | | Material profile Material name | Inorganic particles A | Inorganic particles A | Inorganic particles A | Inorganic particles A |
| | | Material profile Particle name | Silica | Silica | Silica | Silica |
| | | Material profile Surface composition | Methacryloxy group | Methacryloxy group | Methacryloxy group | Methacryloxy group |
| | | Material profile Primary particle diameter | 80 nm | 80 nm | 80 nm | 80 nm |
| | | Amount (parts by weight) | 100 | 100 | 100 | 100 |
| | (d) and (d') | compound | | | | |
| | | Material name | — | — | — | — |
| | | Amount (parts by weight) | — | — | — | — |
| | (e) | Acidic acrylate | | | | |
| | | Material name | TAIH05 | TAIH05 | TAIH05 | TAIH05 |
| | | Amount (parts by weight) | 5 | 5 | 5 | 5 |
| | (f) | Organic solvent-soluble polyimide | | | | |
| | | Material name | Organic solvent-soluble polyimide A | Organic solvent-soluble polyimide A | Organic solvent-soluble polyimide A | Organic solvent-soluble polyimide A |
| | | Amount (parts by weight) | 15 | 15 | 15 | 15 |
| | (g) | Thixotropy enhancing agent | | | | |
| | | Material name | — | — | — | — |
| | | Amount (parts by weight) | — | — | — | — |
| | (h) | Solvent 1 | | | | |
| | | Material name | PGMEA | PGMEA | PGMEA | PGMEA |
| | | Amount (parts by weight) | 95 | 90 | 90 | 90 |
| | | Solvent 2 | | | | |
| | | Material name | — | Cyclohexanone | MIBK | PGME |
| | | Amount (parts by weight) | — | 5 | 5 | 5 |
| Evaluation results | Resin sheet | Before hardening Evaluation for flatness | B | B | B | B |
| | | Stored for 30 min | C | C | C | C |
| | | Stored for 10 hr | | | | |
| | | Minimum melt viscosity (Pa · s) | 130 | 150 | 120 | 160 |
| | | Loss tangent (80° C.) Strain 0.1% | 2.5 | 1.9 | 1.9 | 1.9 |
| | | Strain 10% | 4.4 | 3.8 | 3.7 | 3.7 |
| | | Difference | 1.8 | 1.9 | 1.8 | 1.8 |
| | | After hardening Temperature at maximum loss tangent (° C.) | 178 | 175 | 177 | 177 |
| | | Dispersion particle diameter of inorganic particles (nm) | 101 | 100 | 101 | 101 |
| | Packaging test | Number of air bubbles | B | B | B | B |
| | | Number of passes (of 10 samples) in connection reliability test A | 0 | 0 | 0 | 0 |
| | | Number of passes (of 10 samples) in connection reliability test B | 7 | 7 | 7 | 7 |

TABLE 9

| | | | | | Comparative Example 1 | Comparative Example 2 |
|---|---|---|---|---|---|---|
| Composition | (a) | Epoxy 1 | Material profile | Material name | EPICLON HP-7200H | EPICLON HP-7200H |
| | | | | Basic skeleton | Dicyclopentadiene | Dicyclopentadiene |
| | | | Amount (parts by weight) | | 45 | 45 |
| | | Epoxy 2 | Material profile | Material name | jERYL980 | jERYL980 |
| | | | | Basic skeleton | Bisphenol A | Bisphenol A |
| | | | Amount (parts by weight) | | 10 | 10 |
| | (b) | Microcapsule type hardening acceleration agent | Material profile | Material name | NOVACURE HX-3941HP | NOVACURE HX-3941HP |
| | | | | Amount of hardening acceleration agent | 33 wt % | 33 wt % |
| | | | Amount (parts by weight) | | 30 | 30 |
| | (c) | Inorganic particles | Material profile | Material name | Inorganic particles A | Inorganic particles B |
| | | | | Particle name | Silica | Silica |
| | | | | Surface composition | Methacryloxy group | Aminophenyl group |
| | | | | Primary particle diameter | 80 nm | 500 nm |
| | | | Amount (parts by weight) | | 100 | 100 |
| | (d) or (d') | Diketone compound | Material name | | — | — |
| | | | Amount (parts by weight) | | — | — |
| | (e) | Acidic acrylate | Material name | | TATH05 | |
| | | | Amount (parts by weight) | | 5 | |
| | (f) | Organic solvent-soluble polyimide | Material name | | Organic solvent-soluble polyimide A | Organic solvent-soluble polyimide A |
| | | | Amount (parts by weight) | | 15 | 15 |
| | (g) | Thixotropy enhancing agent | Material name | | — | — |
| | | | Amount (parts by weight) | | — | — |
| | (h) | Solvent | Material name | | PGMEA | PGMEA |
| | | | Amount (parts by weight) | | 90 | 70 |
| Evaluation results | Resin sheet | Before hardening | Evaluation for flatness | Stored for 30 min | C | C |
| | | | | Stored for 10 hr | C | C |
| | | | Minimum melt viscosity (Pa · s) | | 190 | 120 |
| | | | Loss tangent (80° C.) | Strain 0.1% | 2.5 | 2.8 |
| | | | | Strain 10% | 3.2 | 3.1 |
| | | | | Difference | 0.7 | 0.3 |
| | | After hardening | Temperature at maximum loss tangent (° C.) | | 140 | 141 |
| | | | Dispersion particle diameter of inorganic particles (nm) | | 110 | 720 |
| | Packaging test | Number of air bubbles | | | C | C |
| | | Number of passes (of 10 samples) in connection reliability test A | | | 0 | 0 |
| | | Number of passes (of 10 samples) in connection reliability test B | | | 0 | 0 |

Example 47

The same resin sheet as in Example 16 was produced, and then the final press-bonding in the above (5) flip chip packaging process was performed at a load of 250 N/chip. As a result, breakage of the semiconductor chip was not observed, and the evaluation result of air bubbles was A. Furthermore, the above (6) reliability test was performed, and the result was that the number of passes was 10 in both the connection reliability tests A and B.

Comparative Example 3

The same resin sheet as in Comparative Example 1 was produced, and then the final press-bonding in the above (5) flip chip packaging process was performed at a load of 250 N/chip. As a result, breakage of the semiconductor chip was observed, and the evaluation result of air bubbles was C. Since breakage of the semiconductor chip was observed, the above (6) reliability test was not performed.

INDUSTRIAL APPLICABILITY

The resin composition of the present invention can be used as an adhesive drat is used to bond electronic parts used in personal computers and portable terminals to a printed board and a flexible board, bond electronic parts to electronic parts, and bond a hoard to a board. More particularly, the resin composition of the present invention can be suitably used as a resin composition that is used when a semiconductor chip such as IC or LSI is bonded to a circuit board such as a flexible board, glass epoxy board, a glass board, or a ceramic board.

The invention claimed is:

1. A resin composition comprising:
an epoxy compound of a naphthalene skeleton epoxy resin or an anthracene skeleton epoxy resin (a),
a microcapsule type hardening acceleration agent (b),
inorganic particles (c), and
a compound (d) represented by Formula (1):

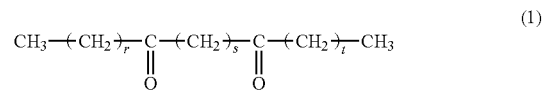

(1)

wherein r, s, and t each represent an integer of 0 to 2, and amount of the microcapsule type hardening acceleration agent (b) is 0.1 to 50 parts by weight based on 100 parts by weight of the epoxy compound (a).

2. The resin composition according to claim 1, wherein the compound (d) represented by Formula (1) is acetylacetone.

3. The resin composition according to claim 1, wherein the inorganic particles (c) have a dispersion particle diameter of 300 nm or less.

4. A method of producing a resin sheet, comprising:
applying the resin composition according to claim 1 to an exfoliative substrate; and then
removing volatile components to obtain a resin sheet.

5. A method of manufacturing a semiconductor device, comprising:
interposing a resin sheet obtained by the production method according to claim 4 between a first circuit component and a second circuit component; and
electrically connecting the first circuit component and the second circuit component by applying heat and pressure.

6. The method of manufacturing a semiconductor device according to claim 5, wherein the pressure in applying heat and pressure is 200 N to 500 N.

7. A resin sheet produced according to the method of claim 4, wherein in a stress measurement in which a dynamic shear strain is applied in a direction parallel to a surface, the difference between a loss tangent as measured when a strain amplitude is 10% of the sheet thickness and a loss tangent as measured when the amplitude is 0.1% of the sheet thickness is equal to or greater than 1 at a temperature of 80° C. and a frequency of 0.5 Hz.

8. A method of manufacturing a semiconductor device, comprising:
interposing the resin sheet according to claim 7 between a first circuit component and a second circuit component; and
electrically connecting the first circuit component and the second circuit component by applying heat and pressure.

9. The method of manufacturing a semiconductor device according to claim 8, wherein the pressure in applying heat and pressure is 200 N to 500 N.

10. The resin composition according to claim 1, wherein the amount of the microcapsule type hardening acceleration agent (b) is 5 to 50 parts by weight based on 100 parts by weight of the epoxy compound (a).

11. The resin composition according to claim 1, comprising the anthracene skeleton epoxy resin.

12. The resin composition according to claim 1, wherein a microcapsule type hardening acceleration agent (b) comprises a dicyandiamide hardening acceleration agent, amine adduct hardening acceleration agent, organic acid hydrazine hardening acceleration agent and/or an aromatic sulfonium salt hardening acceleration agent, and
the inorganic particles (c) comprise silica, alumina, titania, silicon nitride, boron nitride, aluminum nitride, iron oxide, glass, and/or barium sulfate.

* * * * *